(12) United States Patent
Nonoyama et al.

(10) Patent No.: US 8,001,301 B2
(45) Date of Patent: *Aug. 16, 2011

(54) SEMICONDUCTOR DEVICE AND ELECTRONIC INSTRUMENT

(75) Inventors: Mihiro Nonoyama, Kodaira (JP); Masataka Kazuno, Chuo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/683,171

(22) Filed: Jan. 6, 2010

(65) Prior Publication Data
US 2010/0127768 A1    May 27, 2010

Related U.S. Application Data

(63) Continuation of application No. 11/483,556, filed on Jul. 11, 2006, now Pat. No. 7,668,989.

(30) Foreign Application Priority Data

Jul. 28, 2005 (JP) ................................. 2005-219452

(51) Int. Cl.
G06F 13/38 (2006.01)
G06F 3/038 (2006.01)

(52) U.S. Cl. ............ 710/71; 345/156; 345/204; 345/545

(58) Field of Classification Search .................. None
See application file for complete search history.

(56) References Cited

U.S. PATENT DOCUMENTS

| | | | |
|---|---|---|---|
| 5,754,764 A * | 5/1998 | Davis et al. ............ 709/200 |
| 6,222,852 B1 * | 4/2001 | Gandy .................. 370/463 |
| 6,385,754 B1 | 5/2002 | Mizumoto et al. |
| 6,472,747 B2 | 10/2002 | Bazarjani et al. |
| 6,574,685 B1 * | 6/2003 | Schwartz et al. ............ 710/31 |
| 7,123,497 B2 | 10/2006 | Matsui et al. |
| 7,327,590 B2 | 2/2008 | Matsui et al. |
| 7,548,444 B2 | 6/2009 | Matsui et al. |
| 2001/0016925 A1 * | 8/2001 | Bucher et al. .............. 714/39 |
| 2001/0044862 A1 | 11/2001 | Mergard et al. |
| 2002/0011998 A1 | 1/2002 | Tamura |
| 2003/0217244 A1 * | 11/2003 | Kelly ..................... 711/168 |
| 2006/0095613 A1 * | 5/2006 | Venkata et al. ............ 710/62 |
| 2006/0109929 A1 * | 5/2006 | Tripathi .................. 375/272 |
| 2006/0176077 A1 * | 8/2006 | Grabill et al. ............. 326/39 |
| 2006/0214902 A1 | 9/2006 | Tamura |
| 2007/0002189 A1 | 1/2007 | Komatsu et al. |

(Continued)

FOREIGN PATENT DOCUMENTS

JP   A-2001-222249   8/2001

(Continued)

*Primary Examiner* — Henry W Tsai
*Assistant Examiner* — Michael Sun
(74) *Attorney, Agent, or Firm* — Oliff & Berridge, PLC

(57) ABSTRACT

A semiconductor device includes a first semiconductor chip, and a second semiconductor chip which includes a high-speed serial I/F circuit which transfers serial data between the high-speed serial I/F circuit and an external device through a serial bus and is stacked on the first semiconductor chip. A pad region in which pads (electrodes) for connecting the external device and the high-speed serial I/F circuit are disposed is provided along a first side of the second semiconductor chip which is the short side. A pad region in which pads for connecting an internal circuit included in the first semiconductor chip and the high-speed serial I/F circuit are disposed is provided along a second side of the second semiconductor chip which is the long side.

10 Claims, 16 Drawing Sheets

U.S. PATENT DOCUMENTS

| | | | |
|---|---|---|---|
| 2007/0139232 A1* | 6/2007 | Venkata et al. | 341/50 |
| 2007/0283109 A1* | 12/2007 | Kelly | 711/154 |
| 2008/0235411 A1* | 9/2008 | Zhang et al. | 710/28 |
| 2009/0219745 A1 | 9/2009 | Matsui et al. | |

FOREIGN PATENT DOCUMENTS

| | | |
|---|---|---|
| JP | A-2004-523912 | 8/2004 |
| JP | A-2004-327474 | 11/2004 |
| JP | A-2005-141298 | 6/2005 |

* cited by examiner

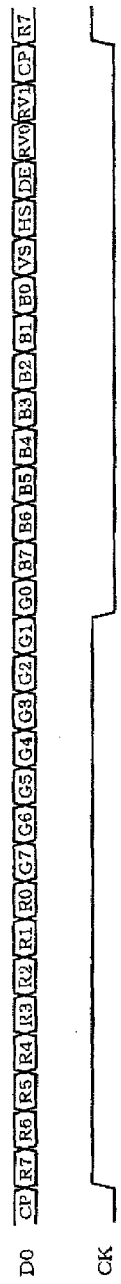
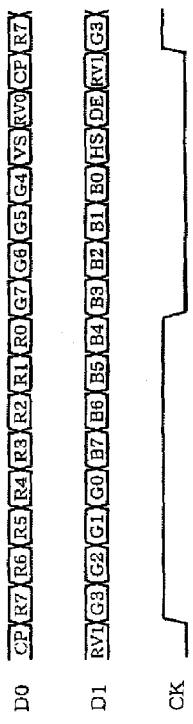
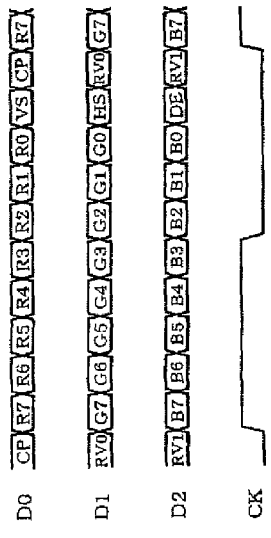
FIG. 6A  SINGLE-CHANNEL MODE
FIG. 6B  TWO-CHANNEL MODE
FIG. 6C  THREE-CHANNEL MODE

FIRST INTERFACE MODE

SECOND INTERFACE MODE

SEMICONDUCTOR DEVICE AND ELECTRONIC INSTRUMENT

This is a Divisional of U.S. patent application Ser. No. 11/483,556 filed on Jul. 11, 2006, which is hereby incorporated by reference in its entirety. This application claims priority to Japanese Patent Application No. 2005-219452 filed Jul. 28, 2005, which is hereby incorporated by reference in its entirety.

BACKGROUND OF THE INVENTION

The present invention relates to a semiconductor device and an electronic instrument.

In recent years, a high-speed serial transfer such as low voltage differential signaling (LVDS) has attracted attention as an interface aiming at reducing EMI noise or the like. In such a high-speed serial transfer, data is transferred by causing a transmitter circuit to transmit serialized data using differential signals and causing a receiver circuit to differentially amplify the differential signals (JP-A-2001-222249).

An ordinary portable telephone includes a first instrument section provided with buttons for inputting a telephone number or characters, a second instrument section provided with a liquid crystal display (LCD) or a camera device, and a connection section (e.g. hinge) which connects the first and second instrument sections. Therefore, the number of interconnects passing through the connection section can be reduced by transferring data between a first circuit board provided in the first instrument section and a second circuit board provided in the second instrument section by serial transfer using small-amplitude differential signals.

In order to realize the high-speed serial transfer in a portable telephone or the like, it is necessary to provide a high-speed serial transfer transmitter circuit or the like in a baseband engine/application processor (BBE/APP) or an image processing controller and provide a high-speed serial transfer receiver circuit or the like in a display driver.

The high-speed serial transfer transmitter circuit or receiver circuit is formed by an analog circuit. Therefore, the analog characteristics change when the manufacturing process has been changed, thereby making it necessary to redesign the circuit. On the other hand, it is necessary to positively employ a microfabrication process for the BBE/APP, image processing controller, or display driver in order to reduce cost. Therefore, the high-speed serial transfer transmitter circuit or receiver circuit must be unnecessarily redesigned when reducing the chip size of the BBE/APP, image processing controller, or display driver using the microfabrication process, whereby the design period may be increased.

SUMMARY

A first aspect of the invention relates to a semiconductor device comprising:

a first semiconductor chip; and a second semiconductor chip which includes a serial interface circuit which transfers serial data between the serial interface circuit and an external device through a serial bus and is stacked on the first semiconductor chip;

a first electrode region in which electrodes for connecting the external device and the serial interface circuit are disposed being provided along a first side of the second semiconductor chip which is a short side; and a second electrode region in which electrodes for connecting an internal circuit included in the first semiconductor chip and the serial interface circuit are disposed being provided along a second side of the second semiconductor chip which is a long side.

A second aspect of the invention relates to an electronic instrument comprising:

the above semiconductor device; and a display panel which performs a display operation based on data serially transferred by the semiconductor device.

BRIEF DESCRIPTION OF THE SEVERAL VIEWS OF THE DRAWING

FIGS. 6A, 6B, and 6C are views illustrative of channel modes.

DETAILED DESCRIPTION OF THE EMBODIMENT

Figure 1A:
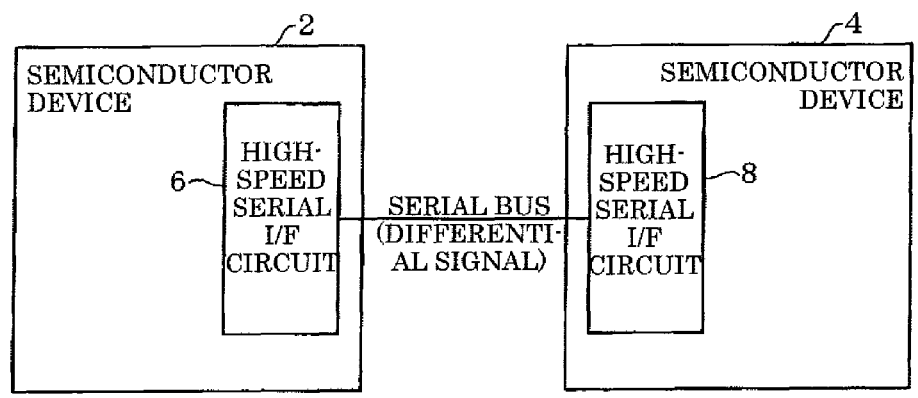
FIGS. 1A and 1B are views illustrative of a serial transfer method and a stack arrangement method according to one embodiment of the invention.

The invention may provide a semiconductor device which can facilitate incorporation of a serial interface circuit, and an electronic instrument.

One embodiment of the invention relates to a semiconductor device comprising:

a first semiconductor chip; and a second semiconductor chip which includes a serial interface circuit which transfers serial data between the serial interface circuit and an external device through a serial bus and is stacked on the first semiconductor chip;

a first electrode region in which electrodes for connecting the external device and the serial interface circuit are disposed being provided along a first side of the second semiconductor chip which is a short side; and a second electrode region in which electrodes for connecting an internal circuit included in the first semiconductor chip and the serial interface circuit are disposed being provided along a second side of the second semiconductor chip which is a long side.

According to this embodiment, the serial interface circuit included in the second semiconductor chip transfers serial data between the serial interface circuit and the external device. In this embodiment, the second semiconductor chip including the serial interface circuit is stacked on the first semiconductor chip. Therefore, even if the manufacturing process, circuit configuration, or the like of the first semiconductor chip has been changed, the manufacturing process, circuit configuration, or the like of the second semiconductor chip need not be changed. Therefore, incorporation of the serial interface circuit into the semiconductor device can be facilitated while maintaining the transmission quality of the serial transfer.

In this embodiment, the first electrode region in which electrodes for connecting the external device and the serial interface circuit are disposed is provided along the first side of the second semiconductor chip which is the short side. This minimizes a signal skew or a signal delay of serial transfer signals, whereby the transmission quality of serial transfer can be maintained. In this embodiment, the second electrode region in which electrodes for connecting the internal circuit included in the first semiconductor chip and the serial interface circuit are disposed is provided along the second side of the second semiconductor chip which is the long side. Therefore, a number of electrodes necessary for interface between the serial interface circuit and the internal circuit of the first semiconductor chip can be disposed in the second electrode region, whereby incorporation of the serial interface circuit into the semiconductor device can be facilitated.

In the semiconductor device according to this embodiment, a third electrode region in which electrodes for connecting the internal circuit included in the first semiconductor chip and the serial interface circuit are disposed may be provided along a third side of the second semiconductor chip opposite to the first side.

This allows the number of electrodes which can be used for interface between the serial interface circuit and the internal circuit to be further increased.

In the semiconductor device according to this embodiment, a serial-transfer serial data electrode may be disposed in the first electrode region.

This allows a data transfer transmitter circuit or receiver circuit and the serial data electrode to be connected through a short path, for example.

In the semiconductor device according to this embodiment, the serial-transfer serial data electrode and a serial-transfer clock signal electrode may be disposed in the first electrode region.

This allows a data transfer transmitter circuit or receiver circuit and the serial data electrode to be connected through a short path, and allows a clock transfer transmitter circuit or receiver circuit and the clock signal electrode to be connected through a short path, for example.

In the semiconductor device according to this embodiment, the serial interface circuit may include:

a physical layer circuit which at least either transmits or receives data between the serial interface circuit and the external device through the serial bus;

a first logic circuit which includes at least one of a parallel/serial conversion circuit which converts parallel data from the internal circuit included in the first semiconductor chip into serial data and a serial/parallel conversion circuit which converts serial data from the external device into parallel data; and a second logic circuit which includes an internal interface circuit which transfers parallel data between the serial interface circuit and the internal circuit included in the first semiconductor chip.

This allows serial data to be transmitted or received through the serial bus using the physical layer circuit and allows conversion from parallel data to serial data or conversion from serial data to parallel data to be performed using the first logic circuit.

Moreover, parallel data can be transferred between the serial interface circuit and the internal circuit included in the first semiconductor chip using the second logic circuit.

In the semiconductor device according to this embodiment, the physical layer circuit may be disposed on a first side of the second semiconductor chip which is a short side; and the second logic circuit may be disposed on a third side of the second semiconductor chip opposite to the first side.

This increases the efficiency of signal transmission in the serial interface circuit.

In the semiconductor device according to this embodiment, the serial interface circuit may include an internal interface circuit which transfers parallel data between the serial interface circuit and the internal circuit included in the first semiconductor chip; and the internal interface circuit may transfer K-bit parallel data between the serial interface circuit and the internal circuit included in the first semiconductor chip in a first interface mode, and may transfer J-bit (J<K) parallel data between the serial interface circuit and the internal circuit included in the first semiconductor chip in a second interface mode which is set when the second semiconductor chip is stacked on the first semiconductor chip.

The number of signal lines between the second semiconductor chip and the internal circuit included in the first semiconductor chip can be reduced by setting the interface mode to the second interface mode when the second semiconductor chip is stacked on the first semiconductor chip.

In the semiconductor device according to this embodiment, electrodes for J-bit parallel data may be disposed along the second side of the second semiconductor chip which is the long side, and electrodes for (K-J)-bit parallel data may be disposed along a fourth side of the second semiconductor chip opposite to the second side.

This allows parallel data to be transferred in the first interface mode using the electrodes for (K-J)-bit parallel disposed along the fourth side, for example.

In the semiconductor device according to this embodiment, the internal interface circuit may sample parallel data at a rising edge or a falling edge of a sampling clock signal for parallel data in the first interface mode, and may sample parallel data at the rising edge and the falling edge of the sampling clock signal in the second interface mode.

This allows parallel data to be sampled at the rising edge and the falling edge of the sampling clock signal in the second interface mode. Therefore, a large amount of information can be transferred using a small number of parallel data signal lines.

In the semiconductor device according to this embodiment, the first semiconductor chip may include a stack prohibited circuit on which another semiconductor chip is prohibited from being stacked; and the second semiconductor chip may be stacked in a region other than a region of the stack prohibited circuit.

This prevents deterioration of the reliability and the characteristics of the circuit of the first semiconductor chip.

In the semiconductor device according to this embodiment, the stack prohibited circuit may be a DRAM.

Note that the stack prohibited circuit is not limited to the DRAM.

In the semiconductor device according to this embodiment, the serial interface circuit may include a physical layer circuit which at least either transmits or receives data between the serial interface circuit and the external device through the serial bus;

the physical layer circuit may include a data transfer transmitter circuit or receiver circuit and a clock transfer transmitter circuit or receiver circuit; and the data transfer transmitter circuit or receiver circuit and the clock transfer transmitter circuit or receiver circuit may be disposed along the first side of the second semiconductor chip which is the short side.

This minimizes a signal skew or a signal delay.

In the semiconductor device according to this embodiment, the physical layer circuit may include first to Nth data transfer transmitter circuits or receiver circuits for first to Nth channels; and the first to Nth data transfer transmitter circuits or receiver circuits may be disposed along the first side of the second semiconductor chip.

This minimizes a signal skew or a signal delay when transferring data using one or more channels.

In the semiconductor device according to this embodiment, the clock transfer transmitter circuit or receiver circuit may be disposed between the first data transfer transmitter circuit or receiver circuit and the second to Nth data transfer transmitter circuits or receiver circuits.

This minimizes a signal skew or a signal delay of data and a clock signal when transferring data using one or more channels.

In the semiconductor device according to this embodiment, when a length of the second side of the second semiconductor chip is referred to as LB, a length of a second side of the first semiconductor chip parallel to the second side of the second semiconductor chip is referred to as LA, and a design rule maximum length of a wire connected to an electrode of the second semiconductor chip from the electrode to an edge of the first semiconductor chip when viewed from a top side is referred to as LM, "LB≧LA−2×LM" may be satisfied.

This allows the second semiconductor chip to be stacked on the first semiconductor chip while satisfying the design rule of the wire maximum length LM.

Another embodiment of the invention relates to an electronic instrument comprising:

the above semiconductor device; and a display panel which performs a display operation based on data serially transferred by the semiconductor device.

Preferred embodiments of the invention are described below in detail. Note that the embodiments described hereunder do not in any way limit the scope of the invention defined by the claims laid out herein. Note that all elements of the embodiments described below should not necessarily be taken as essential requirements for the invention.

1. Stack Arrangement

In this embodiment, as shown in FIG. 1A, semiconductor devices 2 and 4 (integrated circuit devices) respectively include high-speed serial interface (I/F) circuits 6 and 8. The semiconductor devices 2 and 4 transfer data (at least either transmit or receive data) through a serial bus using the high-speed serial I/F circuits 6 and 8. Specifically, the semiconductor devices 2 and 4 transfer data using differential signals, for example. In more detail, the semiconductor devices 2 and 4 transfer data using low voltage differential signals (LVDS). The serial bus may have a single-channel configuration or a multi-channel configuration. A single-end transfer may be performed instead of the differential transfer.

Taking a portable telephone as an example, the semiconductor device 2 shown in FIG. 1A is a BBE/APP or an image processing controller (display controller), and is mounted on a first circuit board in a first instrument section of the portable telephone in which buttons for inputting a telephone number or characters are provided. The semiconductor device 6 is a display driver (LCD driver), and is mounted on a second circuit board in a second instrument section of the portable telephone in which a display panel (LCD) or a camera device is provided.

In related-art technology, data is transferred between semiconductor devices 2 and 4 by a CMOS voltage level parallel transfer. Therefore, the number of interconnects passing through a connection section (e.g. hinge) which connects the first and second instrument sections is increased, whereby the degrees of freedom of the design may be impaired or EMI noise may occur.

In FIG. 1A, data is transferred between the semiconductor devices 2 and 4 by a small-amplitude serial transfer. Therefore, the number of interconnects passing through the connection section between the first and second instrument sections and occurrence of EMI noise can be reduced.

The high-speed serial I/F circuits 6 and 8 respectively include an analog physical layer circuit (transmitter circuit or receiver circuit) for performing a small-amplitude serial transfer. In such a physical layer circuit, the characteristics of the analog circuit change when the manufacturing process is changed, thereby making it necessary to redesign the circuit. On the other hand, a microfabrication process is positively used for the semiconductor devices 2 and 4 in order to reduce cost. Therefore, the high-speed serial I/F circuits 6 and 8 must be unnecessarily redesigned when reducing the chip size of the semiconductor devices 2 and 4 using the microfabrication process, whereby design man-days and cost may be increased.

Figure 1B:
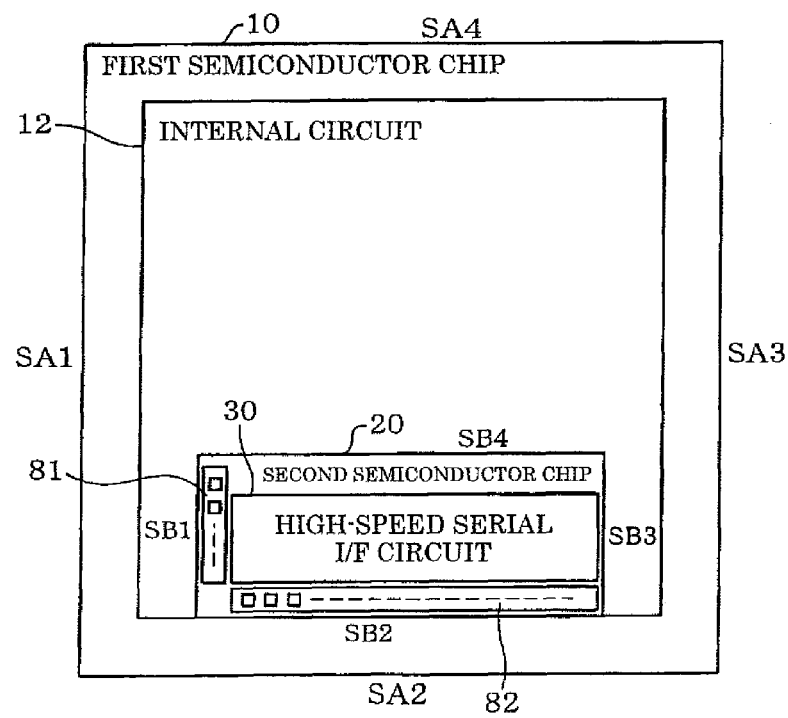

In this embodiment, first and second semiconductor chips 10 and 20 (first and second chips) are provided in a semiconductor device (semiconductor device 2 or 4 in FIG. 1A), as shown in the plan view of FIG. 1B. The first semiconductor chip 10 (main chip) includes an internal circuit 12 (e.g. memory, logic circuit, processor, or driver circuit). The second semiconductor chip 20 (sub chip) includes a high-speed serial I/F circuit 30 (high-speed serial I/F circuit 6 or 8 in FIG. 1A).

In more detail, the high-speed serial I/F circuit 30 (serial interface circuit in a broad sense) transfers serial data between the high-speed serial I/F circuit 30 and an external device (e.g. external semiconductor device) through the serial bus. In this embodiment, the second semiconductor chip 20 including the high-speed serial I/F circuit 30 is stacked on the first semiconductor chip 10 which is the main chip, as shown in FIG. 1B.

In this embodiment, as shown in FIG. 1B, a first pad region 81 (first electrode region in a broad sense) in which pads (electrodes in a broad sense) for connecting the external device and the high-speed serial I/F circuit 30 are disposed is provided along a side SB1 of the second semiconductor chip 20 which is the short side. A second pad region 82 (second electrode region in a broad sense) in which pads (electrodes) for connecting the internal circuit 12 included in the first semiconductor chip 10 and the high-speed serial I/F circuit 30 are disposed is provided along a side SB2 of the second semiconductor chip 20 which is the long side.

Figure 2:
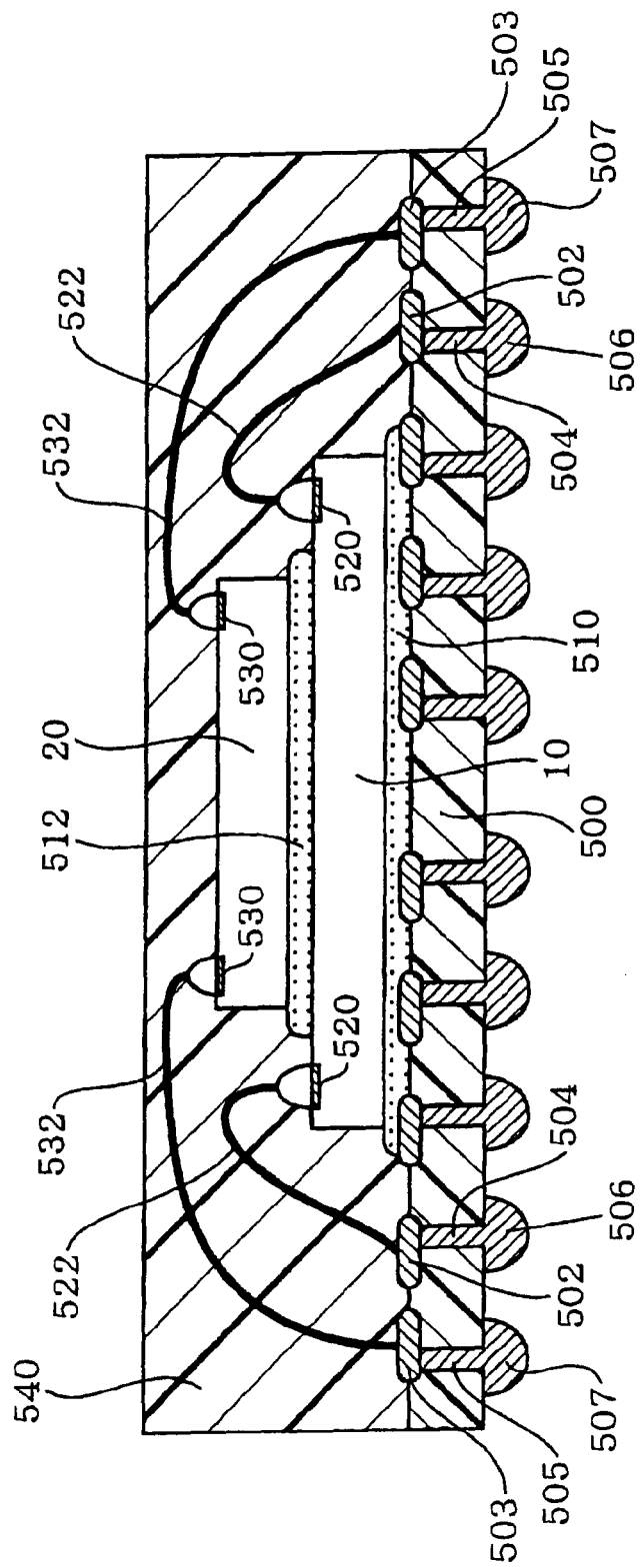
FIG. 2 is a schematic cross-sectional view of a stack structure of first and second semiconductor chips.

FIG. 2 shows an example of a schematic cross-sectional view of the stack structure of the first and second semiconductor chips 10 and 20. As shown in FIG. 2, the first semiconductor chip 10 is bonded to a substrate 500 (interconnect substrate) using a die bonding material 510 (adhesive). The second semiconductor chip 20 is provided to overlap the first semiconductor chip 10, and is bonded to the first semiconductor chip 10 using a die bonding material 512 (adhesive).

An electrode 520 (e.g. pad or bump) formed on the first semiconductor chip 10 is electrically connected with an interconnect pattern 502 (land) of the substrate 500 through a wire 522 (e.g. bonding wire). An electrode 530 (e.g. pad or bump) formed on the second semiconductor chip 20 is electrically connected with an interconnect pattern 503 (land) of the substrate 500 through a wire 532 (e.g. bonding wire). The interconnect patterns 502 and 503 are electrically connected with external terminals 506 and 507 (e.g. solder balls) via through-holes 504 and 505, respectively.

In FIG. 2, the substrate 500 may be formed of an organic material or an inorganic material. The substrate 500 may be a composite structure of an organic material or an inorganic material. As examples of the substrate 500 formed of an organic material, a flexible substrate formed of a polyimide resin and the like can be given. A tape used in TAB technology may be used as the flexible substrate. As examples of the substrate 500 formed of an inorganic material, a ceramic substrate and a glass substrate can be given. As an example of the composite structure of an organic material or an inorganic material, a glass epoxy substrate can be given.

The first and second semiconductor chips 10 and 20 may be mounted face-up so that the active surface (circuit surface) faces upward, or may be mounted face-down so that the active surface faces downward. A stack structure in three or more stages may also be employed differing from the two-stage stack structure shown in FIG. 2. Various materials may be used as the die bonding materials 510 and 512. The bumps may be formed on the electrodes 520 and 530 using a solder ball, gold wire ball, gold plating, or the like. Or, the electrodes 520 and 530 may be formed in the shape of bumps. The wires 522 and 532 may be formed by gold bonding wires, or may be wires formed using a conductive paste or the like. The external terminals 506 and 507 are not limited to the ball shape, but may be in the shape of planar lands.

The electrode 520 of the first semiconductor chip 10 and the electrode 530 of the second semiconductor chip 20 may be electrically connected through the wire 522, the interconnect patterns 502 and 503, and the wire 532, or may be directly connected through a wire (e.g. bonding wire).

As described above, in this embodiment, the second semiconductor chip 20 including the high-speed serial I/F circuit 30 is stacked on top of the first semiconductor chip 10. This facilitates incorporation of the high-speed serial I/F circuit 30 into the semiconductor device.

As a comparative example, the high-speed serial I/F circuit 30 may be incorporated as the internal circuit 12 of the first semiconductor chip 10 (the high-speed serial I/F circuit 30 and the internal circuit 12 are incorporated in a single chip). However, the method of the comparative example requires that the high-speed serial I/F circuit 30 be unnecessarily redesigned when the manufacturing process of the first semiconductor chip 10 (main chip) has been changed due to an upgrade or the like.

On the other hand, this embodiment does not require a change in the manufacturing process of the high-speed serial I/F circuit 30 or the like, even if the manufacturing process of the first semiconductor chip 10 has been changed, thereby significantly reducing design man-days. Moreover, the transmission quality can be maintained since the analog circuit characteristics do not change.

Figure 3A:
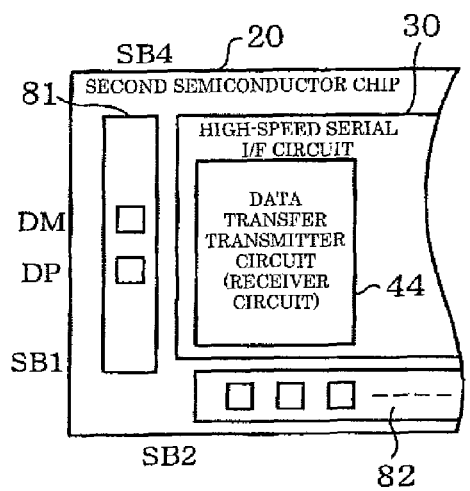
FIGS. 3A, 3B, and 3C are views illustrative of a arrangement method for a pad and a pad region.
Figure 3B:
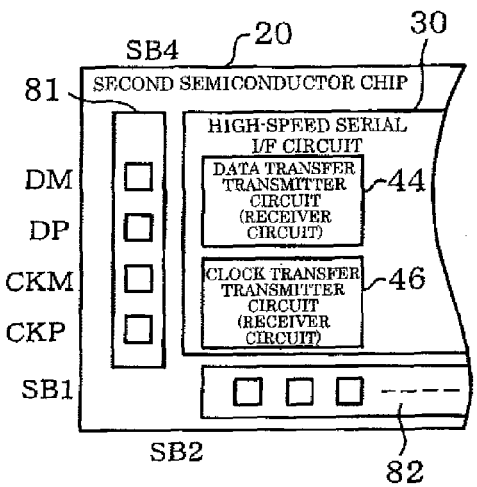

In this embodiment, the pad region 81 in which the pads for serial transfer between the high-speed serial I/F circuit 30 and the external device are disposed is provided along the short side SB1 of the second semiconductor chip 20, as shown in FIG. 1B. According to this configuration, when disposing a data transfer transmitter circuit 44 (or receiver circuit) along the side SB1, as shown in FIG. 3A, serial-transfer serial data pads DP and DM and the transmitter circuit 44 can be connected along a short path, for example. Therefore, a signal skew or a signal delay can be minimized, whereby the transmission quality of serial transfer can be improved. Likewise, when disposing the data transfer transmitter circuit 44 (or receiver circuit) and a clock transfer transmitter circuit 46 (or receiver circuit) along the side SB1, as shown in FIG. 3B, the pads DP and DM and the transmitter circuit 44 can be connected along a short path, and serial-transfer clock signal pads CKP and CKM and the transmitter circuit 46 can be connected along a short path. Therefore, a signal skew or a signal delay of the data or the clock signal can be minimized, whereby a serial data sampling error can be prevented from occurring on the receiver side. Moreover, since the lengths of first and second signal lines (e.g. DP and DM or CKP and CKM) making up the differential signal lines can be equalized by disposing the serial-transfer pads DP, DM, CKP, and CKM along the side SB1 as shown in FIGS. 3A and 3B, deterioration of the transmission quality can be prevented.

Note that only the serial-transfer serial data pads DP and DM may be disposed in the pad region 81 (first electrode region), or only the pads DP and DM and the serial-transfer clock signal pads CKP and CKM may be disposed in the pad region 81 (first electrode region). Or, only the pads DP, DM, CKP, and CKM and an analog circuit (physical layer circuit) power supply pad may be disposed in the pad region 81 (first electrode region). This allows the length of the short side SB1 of the second semiconductor chip 20 to be reduced, whereby the second semiconductor chip 20 can be formed to have a narrow shape. Therefore, when the first semiconductor chip 10 has a stack prohibited circuit on which another semiconductor chip is prohibited from being stacked, the narrow second semiconductor chip 20 can be stacked on the first semiconductor chip 10 while avoiding the region of the stack prohibited circuit.

In this embodiment, the pad region 82 (second electrode region) in which the pads for interface between the high-speed serial I/F circuit 30 and the internal circuit 12 of the first semiconductor chip 10 are disposed is provided along the long side SB2 of the second semiconductor chip 20, as shown in FIG. 1B. A number of pads necessary for interface between the high-speed serial I/F circuit 30 and the internal circuit 12 of the first semiconductor chip 10 can be disposed in the pad region 82 by providing the pad region 82 along the long side SB2. This simplifies connection (transmission) of interface signals between the high-speed serial I/F circuit 30 and the internal circuit 12, whereby incorporation of the high-speed serial I/F circuit 30 into the semiconductor device can be facilitated. Moreover, when connecting the high-speed serial I/F circuit 30 and the internal circuit 12 through a parallel bus, a bus having a sufficient bit width can be used as the parallel bus.

Figure 3C:
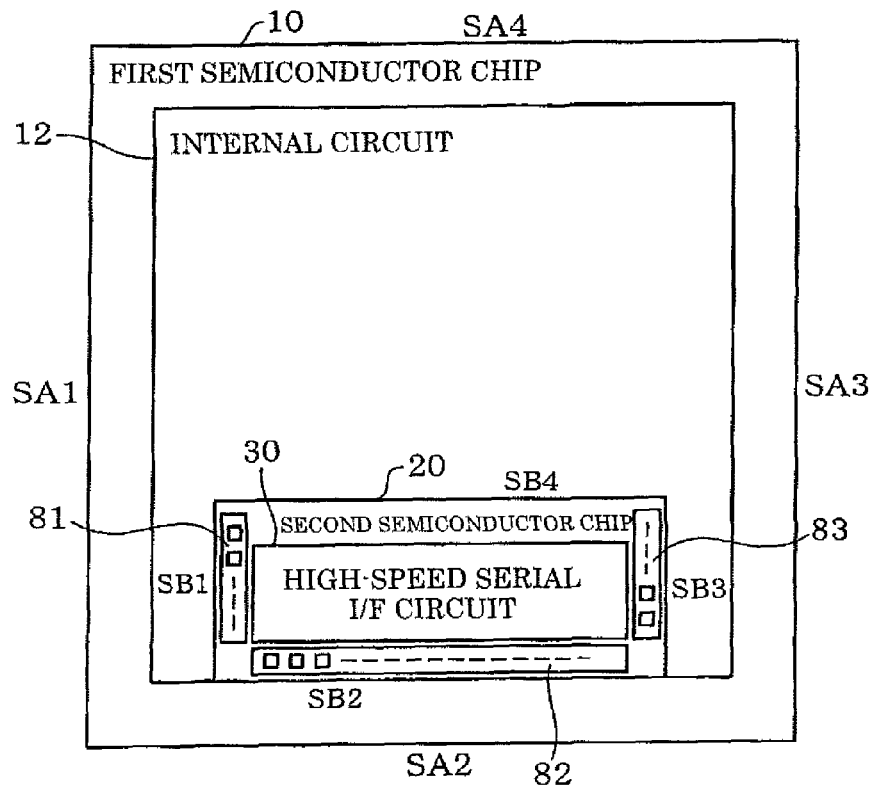

As shown in FIG. 3C, a pad region 83 (third electrode region in a broad sense) in which pads (electrodes) for connecting the internal circuit 12 of the first semiconductor chip 10 and the high-speed serial I/F circuit 30 are disposed may be provided along a side SB3 of the second semiconductor chip 20 opposite to the side SB1. This allows the number of pads used for interface between the high-speed serial I/F circuit 30 and the internal circuit 12 to be further increased, whereby connection (transmission) of interface signals between the high-speed serial I/F circuit 30 and the internal circuit 12 can be further simplified. Moreover, when connecting the high-speed serial I/F circuit 30 and the internal circuit 12 through a parallel bus, the bit width of the parallel bus can be further increased.

2. Configuration and Arrangement of High-speed Serial I/F Circuit

Figure 4A:
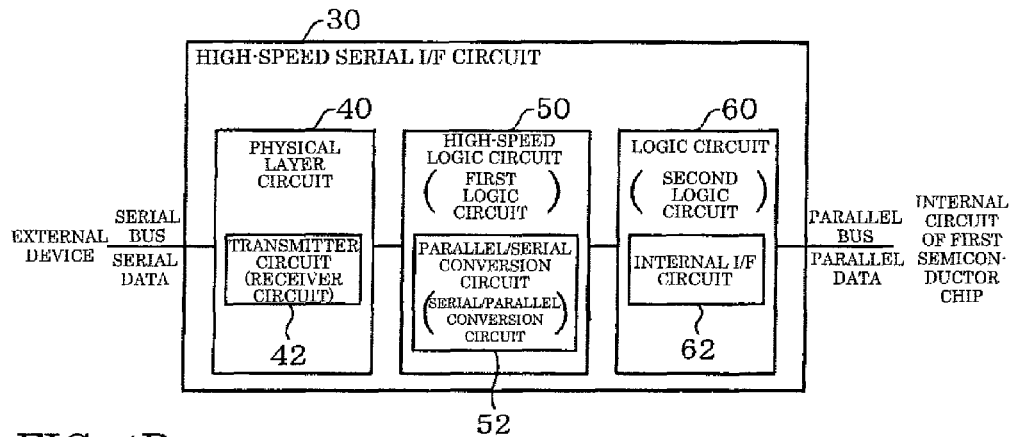
FIGS. 4A and 4B illustrate a configuration and a arrangement example of a high-speed serial I/F circuit.

FIG. 4A shows a configuration example of the high-speed serial I/F circuit 30. Note that the configuration of the high-speed serial I/F circuit 30 is not limited to the configuration shown in FIG. 4A. Some of the elements shown in FIG. 4A may be omitted, or an element other than the elements shown in FIG. 4A may be additionally provided. For example, the high-speed serial I/F circuit 30 may have a configuration in which a high-speed logic circuit 50 or a logic circuit 60 is omitted.

A physical layer circuit 40 (analog circuit, analog front-end circuit, or transceiver) is an analog circuit which at least either transmits or receives data between the high-speed serial I/F circuit 30 and an external device (e.g. external semiconductor device) through the serial bus. The physical layer circuit 40 may include a transmitter circuit 42 or the like. Note that the physical layer circuit 40 may include a transmitter circuit or a receiver circuit. Or, the physical layer circuit 40 may include a transmitter circuit and a receiver circuit. As the transmitter circuit or receiver circuit, a data transfer transmitter circuit or receiver circuit may be provided, or data transfer and clock (strobe) transfer transmitter circuits or receiver circuits may be provided.

The high-speed logic circuit 50 (first logic circuit in a broad sense) is a logic circuit which operates using a high-frequency clock signal. In more detail, the high-speed logic circuit 50 operates using a clock signal having a frequency equal to that of a transfer clock signal of the serial bus. The high-speed logic circuit 50 may include a parallel/serial conversion circuit 52, for example. The parallel/serial conversion circuit 52 is a circuit which converts parallel data from the internal circuit 12 included in the first semiconductor chip 10 (parallel data received by the logic circuit 60 through the parallel bus between the high-speed serial I/F circuit 30 and the internal circuit 12) into serial data. The serial data obtained by conversion is transmitted to the external device through the serial bus.

The high-speed logic circuit 50 may include a parallel/serial conversion circuit, or may include a serial/parallel conversion circuit which converts serial data from the external device (serial data received by the physical layer circuit 40 through the serial bus) into parallel data. Or, the high-speed logic circuit 50 may include a parallel/serial conversion circuit and a serial/parallel conversion circuit. The high-speed logic circuit 50 may include another logic circuit (e.g. FIFO memory, elasticity buffer, or frequency divider circuit) which operates using a high-frequency clock signal equal to the transfer clock signal of the serial bus.

The logic circuit 60 (second logic circuit in a broad sense) is a logic circuit which operates using a clock signal having a frequency lower than that of an operating clock signal of the high-speed logic circuit 50. In more detail, the logic circuit 60 operates using a clock signal having a frequency equal to that of a parallel data sampling clock signal, for example. The logic circuit 60 includes an internal IN circuit 62 (host I/F circuit or parallel I/F circuit) which interfaces between the high-speed serial I/F circuit 30 and the internal circuit 12 included in the first semiconductor chip 10. In more detail, the internal I/F circuit 62 transfers (receives/transmits) parallel data between the high-speed serial I/F circuit 30 and the internal circuit 12 included in the first semiconductor chip 10.

According to the circuit configuration shown in FIG. 4A, a high-speed serial transfer is performed between the high-speed serial I/F circuit 30 and the external device, and a parallel transfer is performed between the high-speed serial I/F circuit 30 and the first semiconductor chip 10 at a speed lower than that of the serial transfer. The transmission quality of the serial transfer can be maintained by optimizing the circuit arrangement and the pad arrangement in the high-speed serial. I/F circuit 30. Since the parallel transfer performed between the high-speed serial I/F circuit 30 and the first semiconductor chip 10 is lower in speed than the serial transfer, it is possible to easily deal with a change in the configuration or the arrangement of the internal circuit 12 of the first semiconductor chip 10 which has been made due to a change in the product specification.

In particular, since various high-speed serial transfer standards have been provided, it is desirable to easily deal with high-speed serial transfers of such various standards. According to the configuration shown in FIG. 4A, a general-purpose parallel I/F can be used as the interface between the high-speed serial I/F circuit 30 and the semiconductor chip 10. Therefore, it is possible to easily deal with high-speed serial transfers of various standards by merely changing the physical layer circuit of the high-speed serial I/F circuit 30 or the like. Moreover, high-speed serial transfers of different standards can be dealt with out changing the configuration of the internal circuit 12 of the first semiconductor chip 10 by using a general-purpose parallel I/F as the interface between the high-speed serial I/F circuit 30 and the semiconductor chip 10. Therefore, a semiconductor device can be provided in which a high-speed serial I/F circuit of various standards can be easily incorporated. Moreover, the package size can be reduced by stacking the first and second semiconductor chips 10 and 20.

Figure 4B:
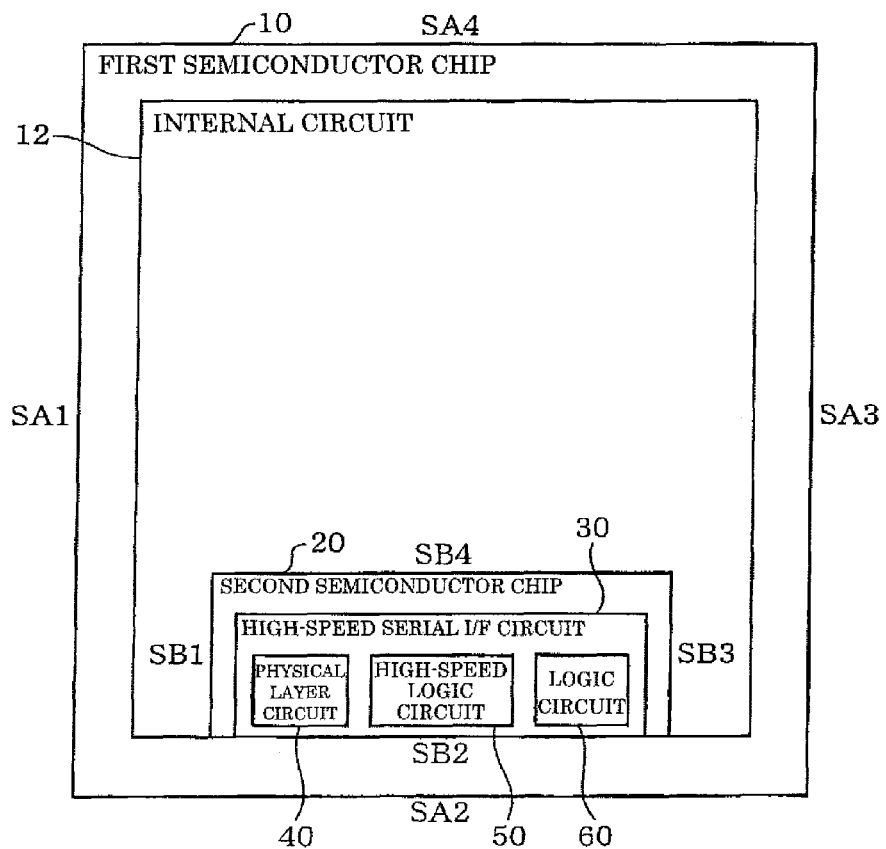

In this embodiment, the physical layer circuit 40 is disposed on the side SB1 of the second semiconductor chip 20 which is the short side, as shown in FIG. 4B. The logic circuit 60 (second logic circuit) is disposed on the side SB3 of the second semiconductor chip 20 opposite to the side SB1. The high-speed logic circuit 50 (first logic circuit) is disposed between the physical layer circuit 40 and the logic circuit 60. Specifically, the physical layer circuit 40, the high-speed logic circuit 50, and the logic circuit 60 are disposed in that order from the side SB1 toward the side SB3.

The circuit arrangement shown in FIG. 4B allows signal lines between the physical layer circuit 40 and the high-speed logic circuit 50 or between the high-speed logic circuit 50 and the logic circuit 60 to be provided along a short path. Therefore, a signal skew or a signal delay between these circuits can be minimized, whereby an efficient high-quality signal transmission can be achieved.

The circuit arrangement shown in FIG. 4B also allows the length of the side SB1 to be reduced and the length of the side SB2 to be increased, whereby the second semiconductor chip 20 can be made narrow. Therefore, when the first semiconductor chip 10 has a stack prohibited circuit (e.g. DRAM or analog circuit) on which another semiconductor chip is prohibited from being stacked, the narrow second semiconductor chip 20 can be stacked on the first semiconductor chip 10 while avoiding the region of the stack prohibited circuit, for example. Since the wire bonding length from the second semiconductor chip 20 can be reduced by making the second semiconductor chip 20 narrow, the mounting quality can be ensured. Moreover, deterioration of the transmission quality can be minimized by reducing the bonding length.

The position at which the second semiconductor chip 20 is stacked is not limited to the position shown in FIG. 4B. In FIG. 4B, the second semiconductor chip 20 is stacked so that one side of the internal circuit 12 almost coincides with one side (SB2) of the second semiconductor chip 20. Note that the second semiconductor chip 20 may be stacked at a position in which the side of the internal circuit 12 does not coincide with the side of the second semiconductor chip 20. The circuit arrangement in the high-speed serial I/F circuit 30 is not limited to the arrangement shown in FIG. 4B. For example, a modification may be made in which the high-speed logic circuit 50 is not disposed between the physical layer circuit 40 and the logic circuit 60.

3. Detailed Configuration of High-speed Serial I/F Circuit

Figure 5:
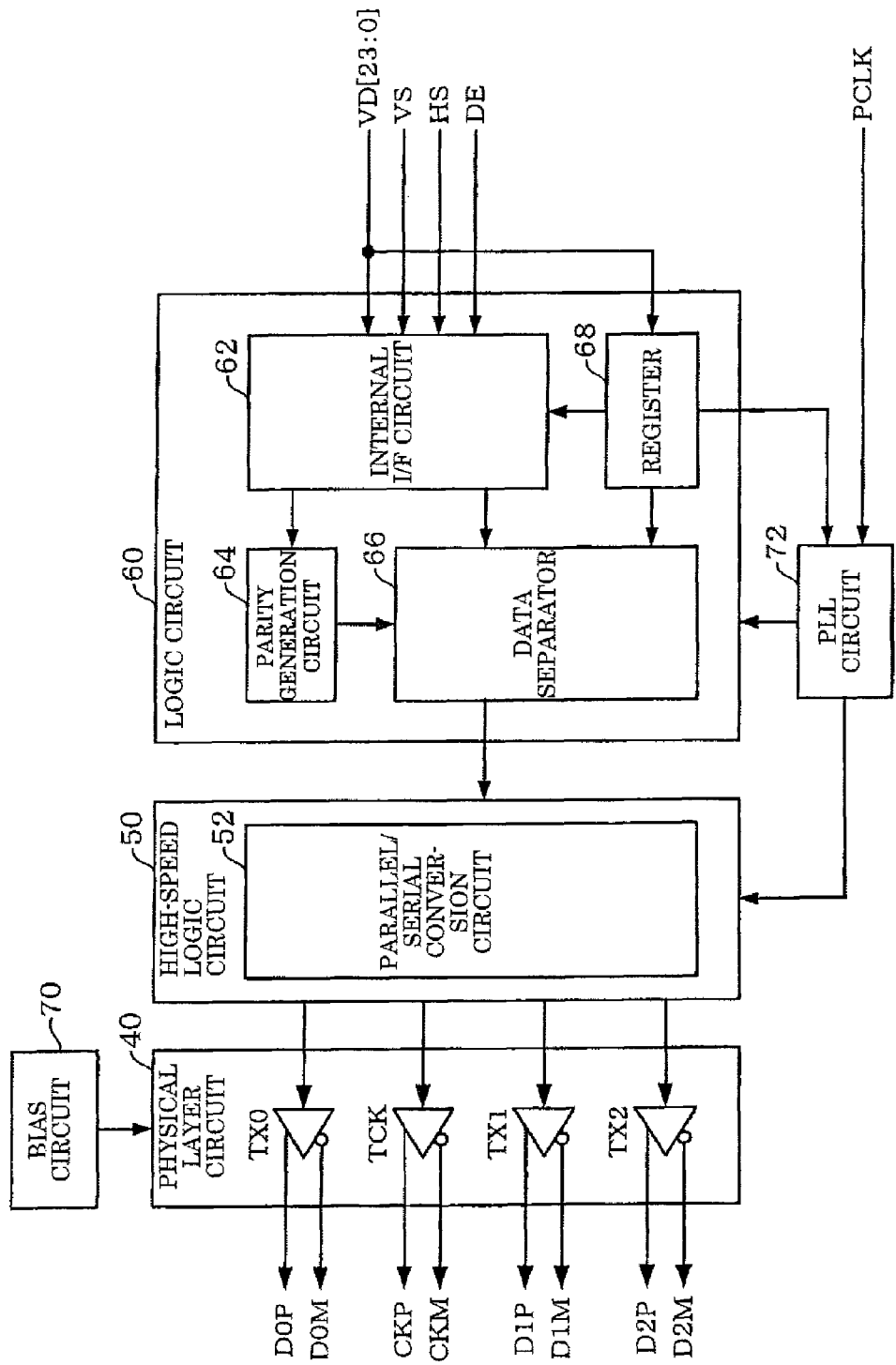
FIG. 5 is a detailed configuration example of the high-speed serial I/F circuit.

FIG. 5 shows a detailed configuration example of the high-speed serial I/F circuit 30. In FIG. 5, the physical layer circuit 40 includes data transfer transmitter circuits TX0, TX1, and TX2 (first to Nth transmitter circuits in a broad sense). The physical layer circuit 40 also includes a clock transfer transmitter circuit TCK.

The data transfer transmitter circuit TX0 receives serial data from the parallel/serial conversion circuit 52, and transmits data by driving differential signal lines D0P and D0M. Likewise, the data transfer transmitter circuits TX1 and TX2 receive serial data from the parallel/serial conversion circuit 52, and transmit data by driving differential signal lines D1P and D1M and differential signal lines D2P and D2M, respectively. The clock transfer transmitter circuit TCK transmits a clock signal by driving CKP and CKM differential signal lines based on a clock signal generated by a PLL circuit 72 (or a clock signal obtained by dividing the frequency of the clock signal generated by the PLL circuit 72). The transmitter circuits TX0, TX1, TX2, and TCK may be realized by analog circuits (e.g. operational amplifiers) which current-drive or voltage-drive differential signal lines of the serial bus, for example.

FIG. 5 shows the case where the physical layer circuit 40 includes the transmitter circuits. Note that the physical layer circuit 40 may include receiver circuits. In this case, data transfer receiver circuits (first to Nth receiver circuits) receive data transferred through the differential signal lines of the serial bus, and output the received serial data to a serial/parallel conversion circuit. A clock transfer receiver circuit receives a clock signal transferred through the differential signal lines of the serial bus. These receiver circuits may be realized by analog circuits which detect the current or voltage by which the differential signal lines of the serial bus are driven. In more detail, the receiver circuit receives data or a clock signal by amplifying the voltage across a resistor element provided between first and second signal lines (e.g. signal lines D0P and D0M) making up the differential signal lines, for example.

A bias circuit 70 generates a bias voltage for controlling a bias current and supplies the bias voltage to the physical layer circuit 40 and the like. The bias circuit 70 may be formed by a reference voltage generation circuit, a current mirror circuit, or the like.

The PLL circuit 72 (clock signal generation circuit in a broad sense) generates a clock signal in synchronization with a pixel clock signal PCLK based on the pixel clock signal PCLK, and supplies the clock signal to the high-speed logic circuit 50 and the like.

The logic circuit 60 includes the internal I/F circuit 62. The logic circuit 60 also includes a parity generation circuit 64, a data separator 66, and a register 68.

The internal I/F circuit 62 interfaces between the high-speed serial I/F circuit 30 and the internal circuit 12 of the first semiconductor chip 10 using interface signals including parallel data VD[23:0], a vertical synchronization signal VS, a horizontal synchronization signal HS, and a data enable signal DE.

The parity generation circuit 64 generates a parity bit added to data. The data separator 66 separates data corresponding to the number of data transfer channels. The register 68 (configuration register) is a register for setting the number of transfer channels, interface mode, and the like.

As shown in FIGS. 6A, 6B, and 6C, the number of channels used can be selected from a single channel, two channels, and three channels depending on the transfer rate by setting the number of transfer channels in the register 68, for example.

In a single-channel mode shown in FIG. 6A, eight-bit R data, eight-bit G data, eight-bit B data, and the like are serially transferred using a first channel D0 (D0P and D0M), for example. In this case, the frequency of the pixel clock signal PCLK is 4 to 15 MHz, and the bandwidth of the transfer rate is 120 to 450 Mbps, for example.

In a two-channel mode shown in FIG. 6B, eight-bit R data, four-bit G data, and the like are transferred using the first channel D0, and four-bit G data, eight-bit B data, and the like are transferred using a second channel D1 (D1P and D1M). In this case, the frequency of the pixel clock signal PCLK is 8 to 30 MHz, and the bandwidth is 120 to 450 Mbps, for example.

In a three-channel mode shown in FIG. 6C, eight-bit R data and the like are transferred using the first channel D0; eight-bit G data and the like are transferred using the second channel D1; and eight-bit B data and the like are transferred using a third channel D2 (D2P and D2M). In this case, the frequency of the pixel clock signal PCLK is 20 to 65 MHz, and the bandwidth is 200 to 650 Mbps, for example.

The separation and rearrangement of data shown in FIGS. 6A, 6B, and 6C are implemented by the data separator 66 shown in FIG. 5.

4. Internal I/F Circuit

The internal I/F circuit 62 according to this embodiment can perform parallel transfers in first and second interface modes between the high-speed serial I/F circuit 30 and the internal circuit 12 of the first semiconductor chip 10.

Figure 7:
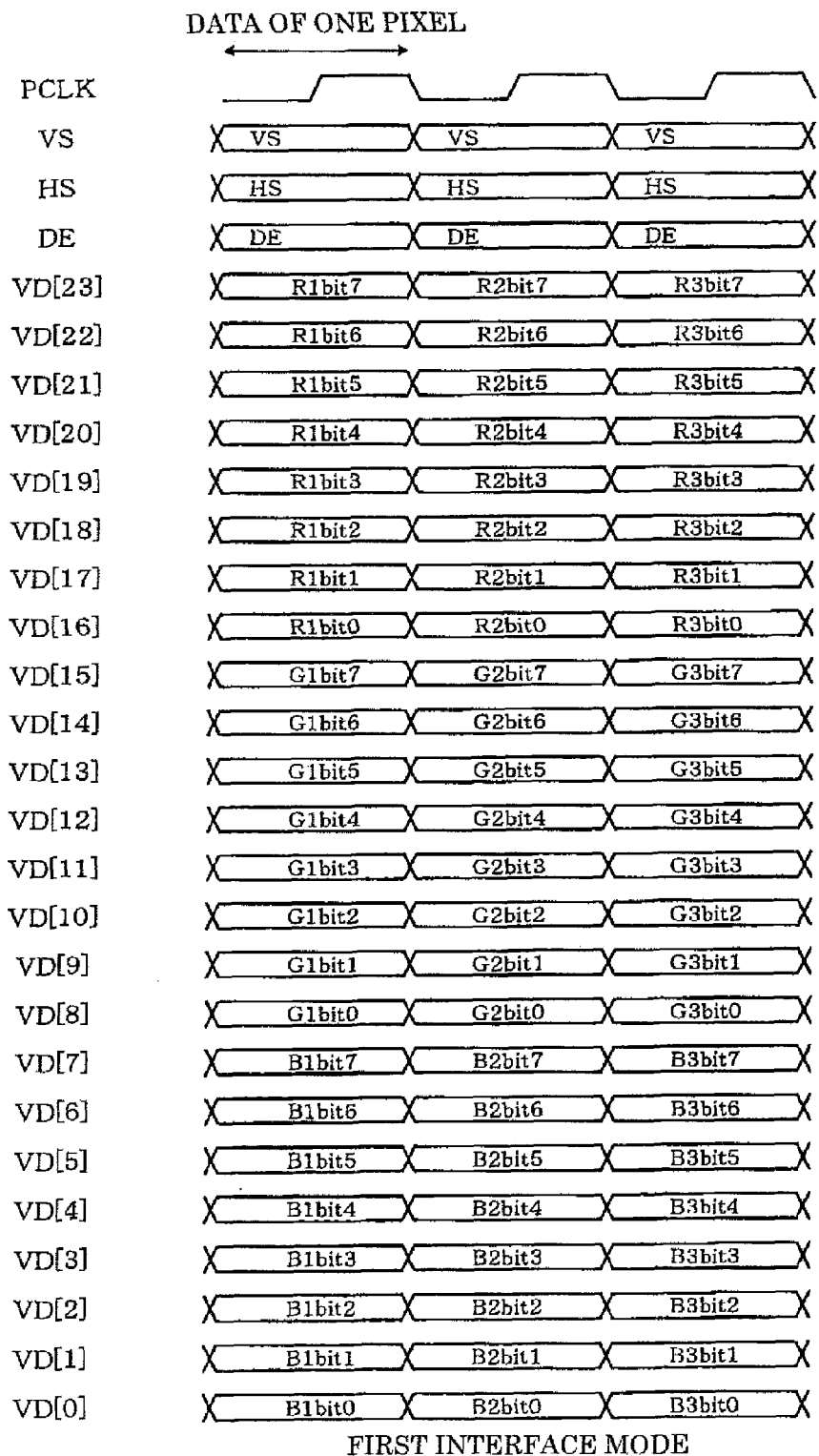
FIG. 7 is a view illustrative of a first interface mode.
Figure 8A:
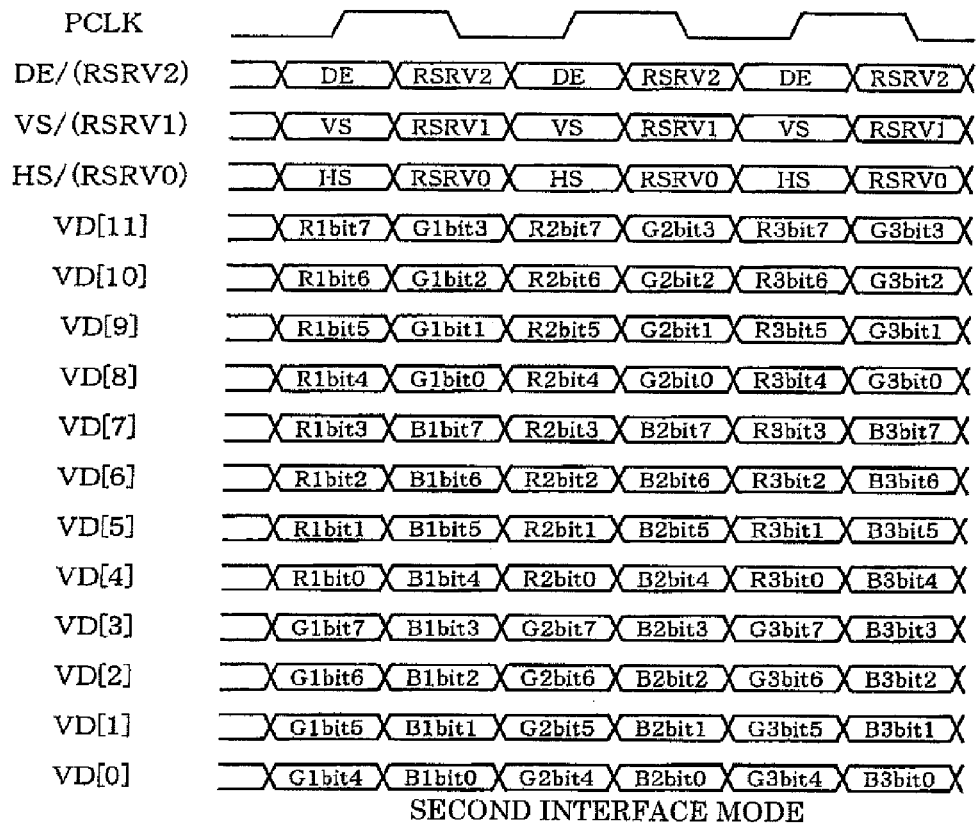
FIGS. 8A and 8B are views illustrative of a second interface mode.

In the first interface mode, the internal I/F circuit 62 transfers 24-bit (K-bit in a broad sense) parallel data between the high-speed serial I/F circuit 30 and the internal circuit 12 of the first semiconductor chip 10, as shown in FIG. 7, for example. In the second interface mode, the internal I/F circuit 62 transfers 12-bit (J-bit in a broad sense; J<K) parallel data between the high-speed serial I/F circuit 30 and the internal circuit 12 of the first semiconductor chip 10, as shown in FIG. 8A. Specifically, in the first interface mode shown in FIG. 7, the internal I/F circuit 62 samples parallel data from the internal circuit 12 at the rising edge (or the falling edge) of the pixel clock signal PCLK which is the parallel data sampling clock signal. In the second interface mode (double data rate mode) shown in FIG. 8A, the internal I/F circuit 62 samples parallel data from the internal circuit 12 at the rising edge and the falling edge of the pixel clock signal PCLK.

Specifically, in the first interface mode shown in FIG. 7, data of one pixel including the eight-bit R data, eight-bit G data, eight-bit B data, and signals VS, HS, and DE is sampled into the internal I/F circuit 62 at the rising edge of the pixel clock signal PCLK. The first interface mode is a standard parallel interface mode in which the 24-bit data VD[23:0] is entirely used.

In the second interface mode shown in FIG. 8A, data including the eight-bit R data, four-bit G data, and signals VS, HS, and DE is sampled into the internal I/F circuit 62 at the rising edge of the pixel clock signal PCLK. Data including the four-bit G data, eight-bit B data, and reserve bits RSRV0, RSRV1, and RSRV2 is sampled into the internal I/F circuit 62 at the falling edge of the pixel clock signal PCLK. The second interface mode is a mode for decreasing the number of connection signal lines between the high-speed serial I/F circuit 30 and the first semiconductor chip 10 (host chip). The second interface mode allows 24-bit data (display data) to be transferred using only the 12-bit data VD[11:0].

Specifically, when stacking the second semiconductor chip 20 on the first semiconductor chip 10 as shown in FIG. 4B, it is difficult to bond a wire to each pad (electrode in a broad sense) on the sides SB1 to SB4 of the second semiconductor chip 20 due to limitations to the design rule of the bonding length. Therefore, when stacking the second semiconductor chip 20 on the first semiconductor chip 10, the number of pads to which a wire can be bonded is limited.

On the other hand, the second semiconductor chip 20 may be used as an independent general-purpose chip instead of stacking the second semiconductor chip 20 on the first semiconductor chip 10. When using the second semiconductor chip 20 as a general-purpose chip, wires can be bonded to the pads on the sides SB1 to SB4 of the second semiconductor chip 20.

Figure 11:
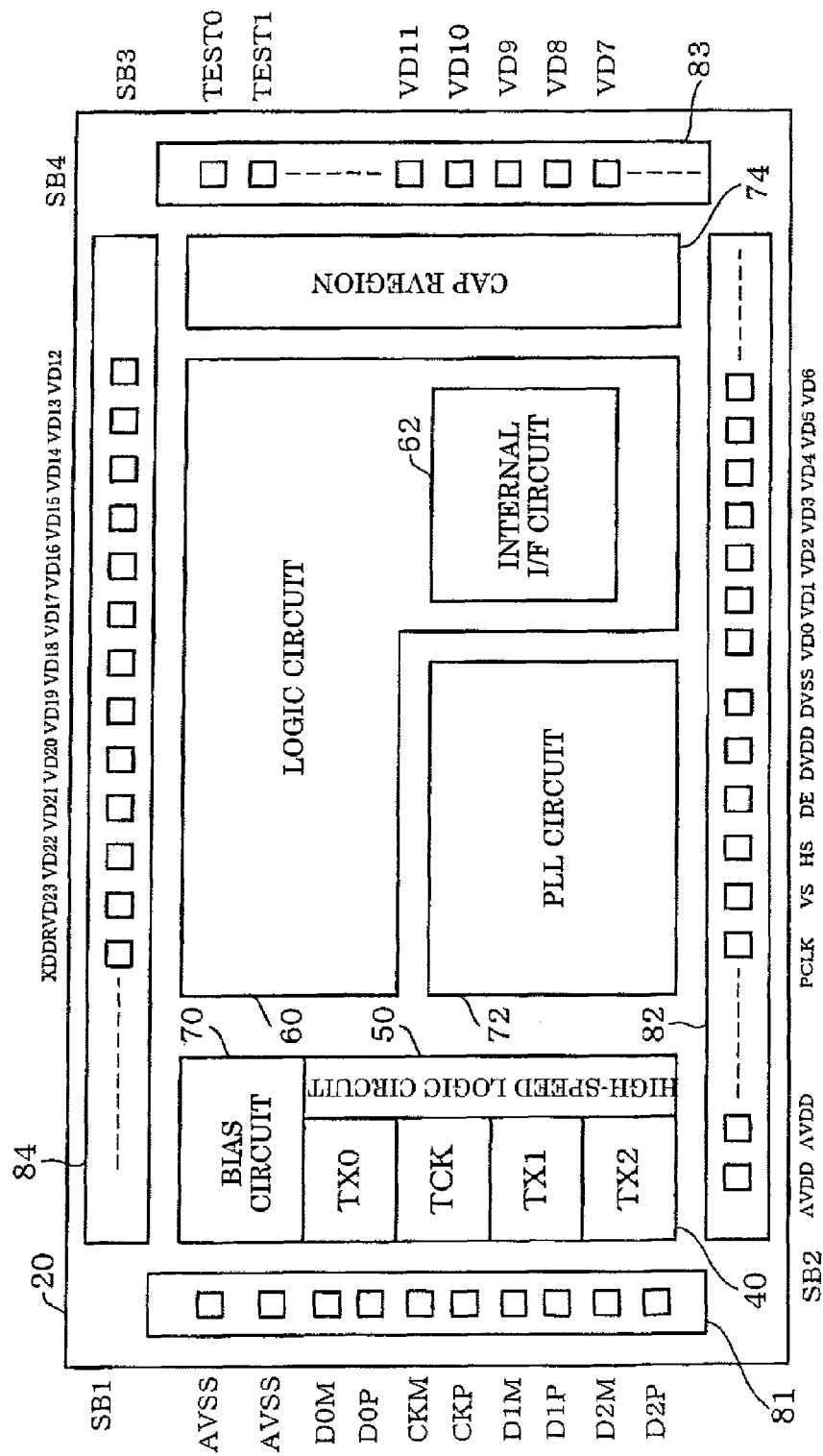
FIG. 11 is a detailed arrangement example of each circuit of the second semiconductor chip.

In this embodiment, when using the second semiconductor chip 20 as an independent general-purpose chip, the interface mode is set to the first interface mode shown in FIG. 7 so that data is transferred using the pads for the 24-bit data VD[23:0]. In more detail, as shown in FIG. 11 described later, the pads for the data VD[11:0] are disposed on the sides SB2 and SB3 of the second semiconductor chip 20, and the pads for the data VD[23:12] are disposed on the side SB4, for example. In the first interface mode, wires are bonded to all of the pad for the data VD[23:0] on the sides SB2, SB3, and SB4, and data is transferred using the 24-bit data VD[23:0], as shown in FIG. 7. This allows the second semiconductor chip 20 to be used in a standard 24-bit parallel interface mode, whereby the versatility of the second semiconductor chip 20 can be improved.

On the other hand, when stacking the second semiconductor chip 20 on the first semiconductor chip 10, the interface mode is set to the first interface mode shown in FIG. 8A so that data is transferred using only the pads for the 12-bit data VD[11:0]. In more detail, wires are bonded to only the pads for the data VD[11:0] on the sides SB2 and SB3 in FIG. 11 described later, and data is transferred using only the 12-bit data VD[11:0], as shown in FIG. 8A. This makes it unnecessary to bond wires to the pads for the data VD[23:12] on the side SB4 when stacking the second semiconductor chip 20 on the first semiconductor chip 10, whereby the design rule of the bonding length can be satisfied. Therefore, the second semiconductor chip 20 can be suitably used a stack chip.

According to this embodiment, the second semiconductor chip 20 can be used as an independent general-purpose chip and a stack chip by providing the first and second interface modes, whereby convenience can be improved. The mode may be switched between the first and second interface modes using a voltage level applied to a mode setting pad (e.g. XDDR) provided to the second semiconductor chip 20, for example.

In the second interface mode shown in FIG. 8A, the reserve bits RSRV0, RSRV1, and RSRV2 are multiplexed with the signals HS, VS, and DE. Specifically, the internal I/F circuit 62 can acquire information from the signals HS, VS, and DE by sampling the signals HS, VS, and DE at the rising edge (one edge in a broad sense) of the pixel clock signal PCLK, and can acquire information from the reserve bits RSRV0, RSRV1, and RSRV2 which is information other than the information from the signals HS, VS, and DE by sampling the signals HS, VS, and DE at the falling edge (the other edge in a broad sense) of the pixel clock signal PCLK. Various types of information can be transferred between the high-speed serial I/F circuit 30 and the internal circuit 12 of the first semiconductor chip 10 by using the reserve bits RSRV0, RSRV1, and RSRV2.

For example, a command such as a reset command, shutdown command, or operation mode switch command can be transferred to a receiver (RX) side by using the reserve bits RSRV0, RSRV1, and RSRV2.

Figure 8B:
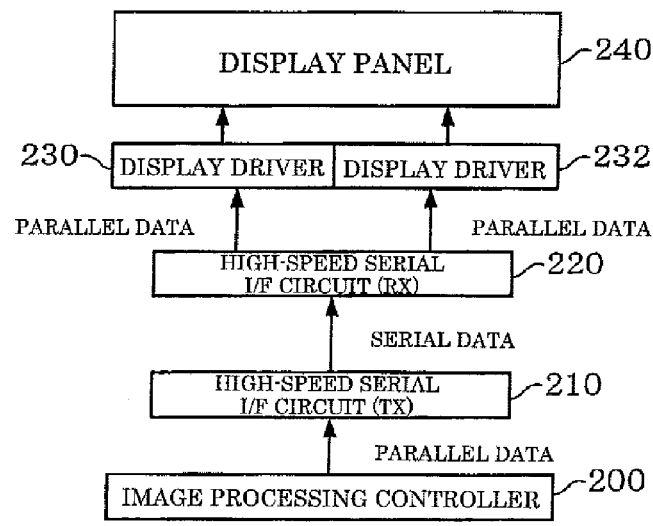

Or, when using two (a plurality of) display drivers 230 and 232 corresponding to one line of a display panel 240, as shown in FIG. 8B, the destination (display driver 230 or 232) of data can be designated by using the reserve bits RSRV0, RSRV1, and RSRV2. For example, an image processing controller 200 (internal circuit 12) transfers parallel data and destination information of the data designated by using the reserve bits RSRV0, RSRV1, and RSRV2 to a transmitter (TX) side high-speed serial I/F circuit 210 (internal I/F circuit). The transmitter (TX) side high-speed serial I/F circuit 210 converts the information into serial data, and transfers the serial data to a receiver (RX) side high-speed serial I/F circuit 220. The receiver side high-speed serial I/F circuit 220 outputs the data from the transmitter side to the display driver 230 when RSRV0=RSRV1=RSRV2=0, and outputs the data from the transmitter side to the display driver 232 when RSRV0=RSRV1=RSRV2=1, for example. Since various attributes can be added in pixel data units by using the reserve bits RSRV0, RSRV1, and RSRV2, various new applications can be realized.

Figure 9:
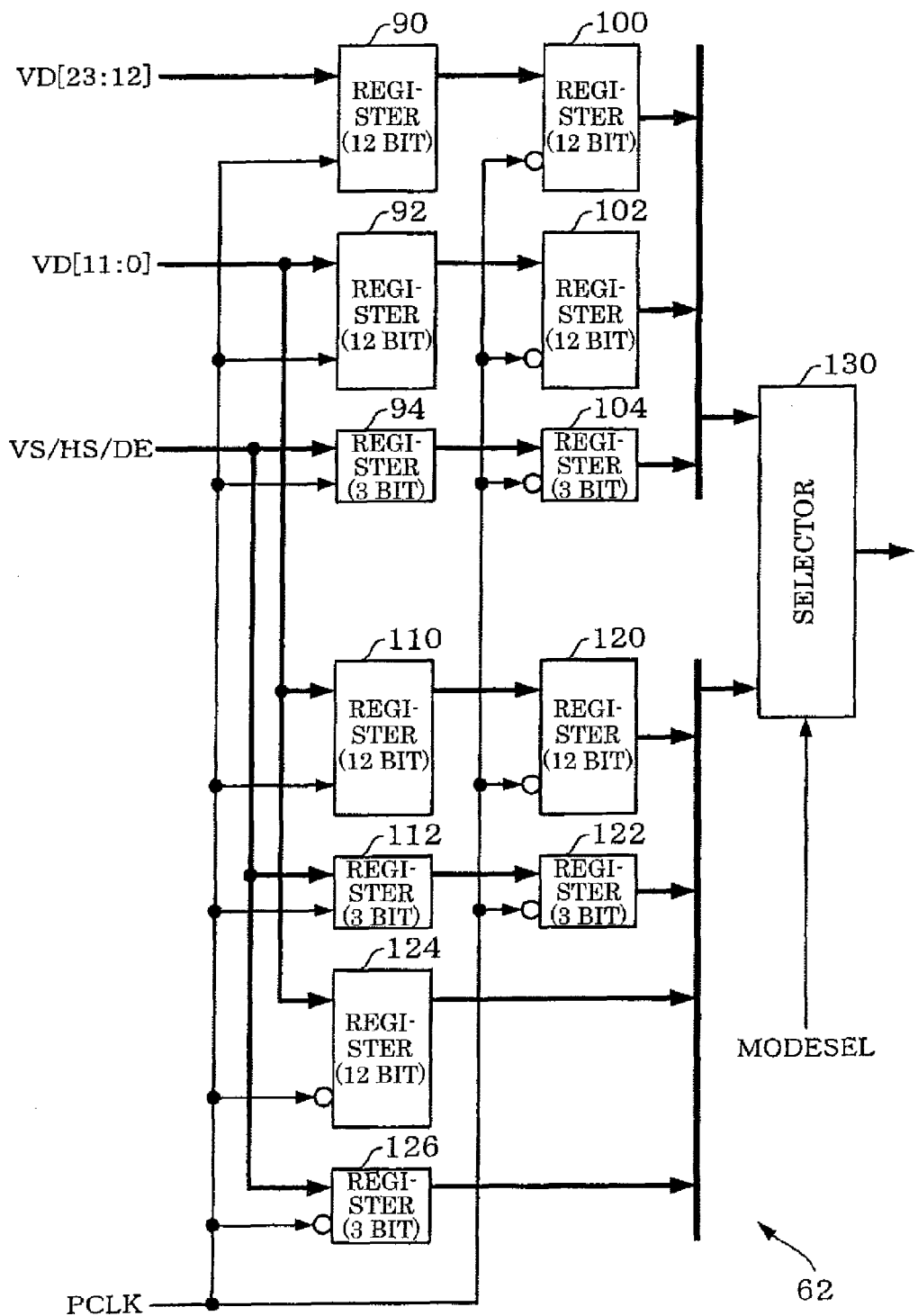
FIG. 9 is a configuration example of an internal I/F circuit.

FIG. 9 shows a configuration example of the internal I/F circuit 62 which can implement the above-described first and second interface modes. In FIG. 9, registers 90, 92, and 94 respectively sample and capture the data VD[23:12], data VD[11:0], and signals VS/HS/DE at the rising edge of the pixel clock signal PCLK. Registers 100, 102, and 104 respectively sample and capture the outputs from the registers 90, 92, and 94 at the falling edge of the pixel clock signal PCLK. When a signal MODESEL has been set to the first interface mode, a selector 130 selects the outputs from the registers 100, 102, and 104, and outputs the selected data to the circuit in the subsequent stage (e.g. data separator 66).

Registers 110 and 112 respectively sample and capture the data VD[11:0] and the signals VS/HS/DE at the rising edge of the pixel clock signal PCLK. Registers 120 and 122 respectively sample and capture the outputs from the registers 110 and 112 at the falling edge of the pixel clock signal PCLK. Registers 124 and 126 respectively sample and capture the data VD[11:0] and the signals VS/HS/DE at the falling edge of the pixel clock signal PCLK. When the signal MODESEL has been set to the second interface mode, the selector 130 selects the outputs from the registers 120, 122, 124, and 126, and outputs the selected data to the circuit in the subsequent stage.

The data transfer in the first and second interface modes shown in FIGS. 7 and 8A can be achieved by the above operation.

5. Detailed Arrangement Example

Figure 10:
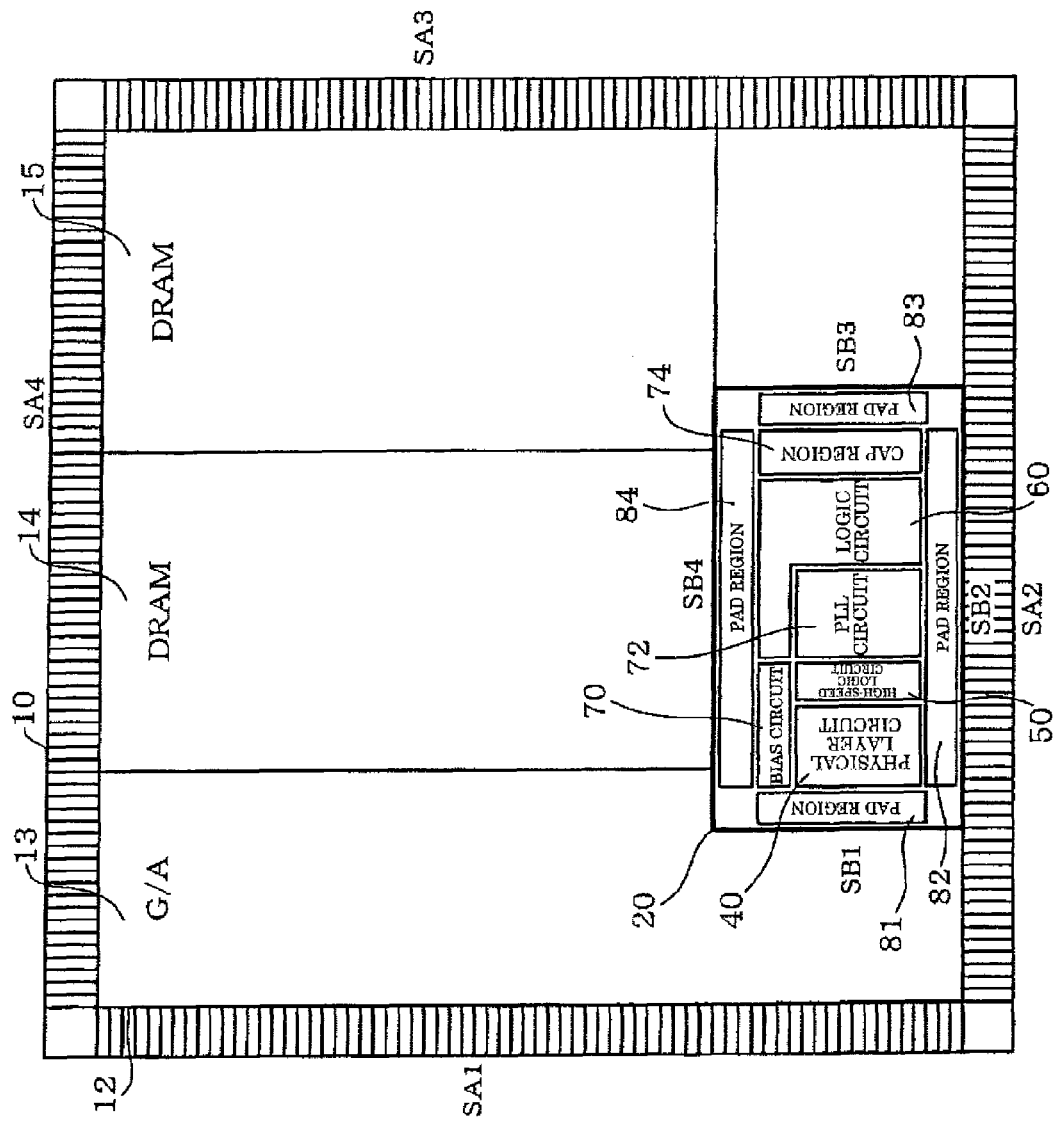
FIG. 10 is a detailed arrangement example of the first and second semiconductor chips.

A detailed arrangement example of the circuits included in the first and second semiconductor chips 10 and 20 is described below. FIG. 10 shows a detailed arrangement example of the first and second semiconductor chips 10 and 20. In FIG. 10, the first semiconductor chip 10 includes a gate array (G/A) 13, DRAMs 14 and 15, and the like as the internal circuit 12. The DRAMs 14 and 15 are circuits on which another semiconductor chip is prohibited from being stacked (hereinafter called "stack prohibited circuit").

As shown in FIG. 10, the second semiconductor chip 20 is stacked in a region (G/A 13) other than the region of the stack prohibited circuits (DRAMs 14 and 15) when viewed from the top side. A situation in which the reliability and the characteristics of the circuit of the first semiconductor chip 10 deteriorate due to the stacked second semiconductor chip 20 can be prevented by disposing the second semiconductor chip 20 in such a region.

Specifically, when the second semiconductor chip 20 is stacked, the stress caused by the second semiconductor chip 20 applies an external pressure to the first semiconductor chip 10, whereby the reliability of the circuit of the first semiconductor chip 10 may deteriorate. For example, the DRAMs 14 and 15 may include fuse circuits for fine characteristic adjustment, and the fuse circuits may be weak against the external pressure. In this case, the reliability of the circuit deteriorates if the second semiconductor chip 20 is stacked on the DRAMs 14 and 15. Since the high-speed serial I/F circuit 30 included in the second semiconductor chip 20 operates at a high speed, noise caused by the high-speed operation may adversely affect the operation of the memory or the analog circuit included in the first semiconductor chip 10. For example, the memory cells of the DRAMs 14 and 15 may malfunction due to noise from the high-speed serial I/F circuit 30, whereby the data which has been held in the memory cells may be lost.

According to this embodiment, since the second semiconductor chip 20 is stacked in a region other than the region of the stack prohibited circuit, the above problem can be prevented. In particular, the second semiconductor chip 20 in this embodiment is narrow. Therefore, the second semiconductor chip 20 can be easily disposed to avoid the region of the DRAMs 14 and 15, as shown in FIG. 10, whereby deterioration of the reliability and the characteristics of the circuit can be effectively prevented.

Note that the region of the stack prohibited circuit is not limited to the region of the DRAMs 14 and 15. For example, the region of the stack prohibited circuit may be the region of the analog circuit of which the reliability and the characteristics may deteriorate when the second semiconductor chip 20 is stacked thereon.

FIG. 11 shows a detailed arrangement example of each circuit of the second semiconductor chip 20. In this embodiment, the physical layer circuit 40 is disposed on the side SB1 of the second semiconductor chip 20, and the logic circuit 60 is disposed on the side SB3 of the second semiconductor chip 20, as shown in FIG. 11. The high-speed logic circuit 50 is disposed between the physical layer circuit 40 and the logic circuit 60. The pad regions 81, 82, 83, and 84 (first, second, third, fourth electrode regions or I/O regions in a broad sense) are respectively provided along the sides SB1, SB2, SB3, and SB4 of the second semiconductor chip 20. Note that a modification is also possible in which the pad regions 83 and 84 are omitted.

In this embodiment, a CAP region 74 (capacitor formation region) is provided between the logic circuit 60 and the side SB3, as shown in FIG. 11. A capacitor for stabilizing power (digital power) supplied to the second semiconductor chip 20 is formed in the CAP region 74. The capacitor may be formed by utilizing a gate capacitor of a basic cell of the G/A of the logic circuit 60, for example.

Figure 12:
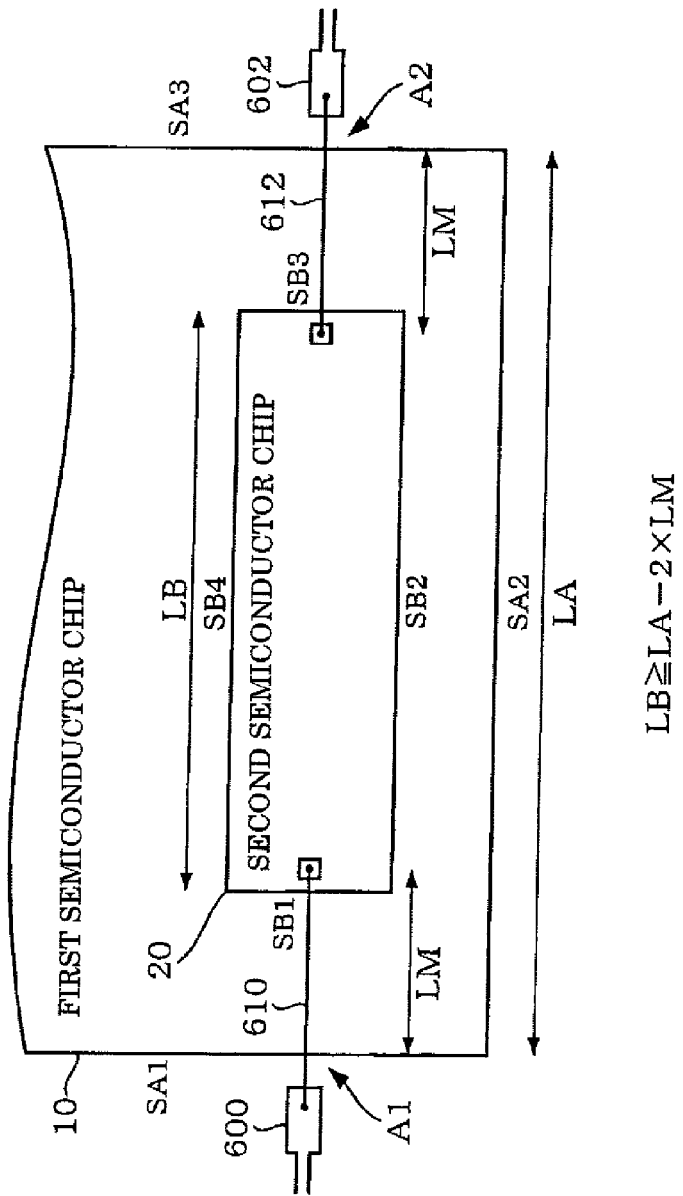
FIG. 12 is a view illustrative of limitations to the bonding length.

In FIG. 11, the second semiconductor chip 20 is formed to have a narrow shape due to limitations to the design rule of the bonding length and the like. The pad region 81 is provided along the side SB1, and the pad region 83 is provided along the side SB3. Therefore, it is necessary to bond wires to the pads in the pad region 81 and the pads in the pad region 83. Therefore, the length LB of the side SB2 of the second semiconductor chip 20 is set so that the wires can be bonded to these pads, as shown in FIG. 12 described later. When the length LB of the side SB2 is increased, a space is formed between the logic circuit 60 and the side SB3 (pad region 83).

According to this embodiment, since the CAP region 74 is formed between the logic circuit 60 and the side SB3, the space can be effectively utilized, as shown in FIG. 11. Moreover, since power supplied to the second semiconductor chip 20 can be stabilized by providing the CAP region 74, the circuit operation can be stabilized and EMI noise can be reduced.

In FIG. 11, the physical layer circuit 40 includes the data transfer transmitter circuit TX0 and the clock transfer transmitter circuit TCK. The data transfer transmitter circuit TX0 and the clock transfer transmitter circuit TCK are disposed along the side SB1 (short side) of the second semiconductor chip 20.

In this embodiment, the transmitter circuits TX0, TX1, and TX2 (first to Nth transmitter circuits in a broad sense) for the first to third channels are provided as the data transfer transmitter circuits, as described with reference to FIGS. 5 to 6C. The transmitter circuits TX0, TX1, and TX2 are disposed along the side SB1 of the second semiconductor chip 20.

In FIG. 11, the clock transfer transmitter circuit TCK is disposed between the transmitter circuit TX0 (first transmitter circuit) and the transmitter circuits TX1 and TX2 (second to Nth transmitter circuits).

According to the arrangement shown in FIG. 11, when disposing the high-speed serial transfer pads D0M, D0P, CKM, CKP, D1M, D1P, D2M, and D2P in the pad region 81 (first electrode region) along the side SB1, signal lines from these pads can be connected with the transmitter circuits TX0, TCK, TX1, and TX2 along a short path. Therefore, a signal skew or a signal delay can be minimized. Moreover, since the lengths of the first and second signal lines (e.g. signal lines D0M and D0P) making up the differential signal lines can be equalized, deterioration of the transmission quality can be prevented. In addition, since the length of the side SB1 can be minimized, the second semiconductor chip 20 can be easily formed to have a narrow shape.

In the single-channel mode shown in FIG. 6A, the data is transferred by the transmitter circuit TX0, and the clock signal is transferred by the transmitter circuit TCK. In FIG. 11, the transmitter circuits TX0 and TCK are adjacently disposed. Therefore, skew of the data and the clock signal can be minimized in the single-channel mode, whereby a sampling error can be prevented from occurring on the receiver side.

In the two-channel mode shown in FIG. 6B, the data is transferred by the transmitter circuits TX0 and TX1, and the clock signal is transferred by the transmitter circuit TCK. In FIG. 11, the transmitter circuits TX0 and TCK are adjacently disposed, and the transmitter circuits TX1 and TCK are also adjacently disposed. Therefore, skew of the data and the clock signal can also be minimized in the two-channel mode, whereby a sampling error can be prevented from occurring on the receiver side.

In the three-channel mode shown in FIG. 6C, the data is transferred by the transmitter circuits TX0, TX1, and TX2, and the clock signal is transferred by the transmitter circuit TCK. In FIG. 11, the transmitter circuits TX0 and TCK are adjacently disposed, the transmitter circuits TX1 and TCK are adjacently disposed, and the transmitter circuit TX2 is disposed near the transmitter circuit TCK. Therefore, skew of the data and the clock signal can also be minimized in the three-channel mode, whereby a sampling error can be prevented from occurring on the receiver side.

In FIG. 11, the high-speed serial transfer pads D0M, D0P, CKM, CKP, D1M, D1P, D2M, and D2P for connecting the external device and the high-speed serial I/F circuit 30 are disposed in the pad region 81 along the side SB1. On the other hand, the interface pads VD[11:0], PCLK, VS, HS, DE, and the like for connecting the internal circuit 12 of the first semiconductor chip 10 and the high-speed serial I/F circuit 30 are disposed in the pad region 82 along the side SB2 or the pad region 83 along the side SB3. Therefore, signal lines from the logic circuit 60 (internal I/F circuit 62) to the pads VD[11:0], PCLK, VS, HS, and DE can be provided along a short path, whereby a signal skew or a signal delay can be minimized. Moreover, since wires from the pads VD[11:0], PCLK, VS, HS, and DE to the interconnect pattern of the substrate or the pads (electrodes) of the first semiconductor chip 10 can be provided along a short path, mounting can be facilitated.

In FIG. 11, the pads VD[23:12] are disposed in the pad region 84 along the side SB4. In this embodiment, the first interface mode shown in FIG. 7 and the second interface mode shown in FIG. 8A are provided. The first and second interface modes are set by setting the pad XDDR and the like disposed in the pad region 84 at a specific voltage level.

In this embodiment, when the second semiconductor chip 20 is used as an independent general-purpose chip, the interface mode is set to the first interface mode. In this case, wires are bonded to the pads VD[11:0] disposed in the pad regions 82 and 83 and the pads VD[23:12] disposed in the pad region 84, and data is transferred using the 24-bit data VD[23:0] shown in FIG. 7. This allows the second semiconductor chip 20 to be used in a standard 24-bit parallel interface mode, whereby the versatility of the second semiconductor chip 20 can be improved.

On the other hand, when the second semiconductor chip 20 is stacked on the first semiconductor chip 10, the interface mode is set to the second interface mode. In this case, wires are bonded to the pads VD[11:0] disposed in the pad regions 82 and 83 without bonding wires to the pads VD[23:12] disposed in the pad region 84, and data is transferred using the 12-bit data VD[11:0] shown in FIG. 8A. This allows data to be transferred between the second semiconductor chip 20 and the internal circuit 12 of the first semiconductor chip 10 through minimum signal lines by using the second semiconductor chip 20 as a stack chip.

FIG. 11 shows the arrangement method for the transmitter (TX) side transmitter circuits TX0, TCK, TX1, and TX2. Note that receiver (RX) side receiver circuits may be disposed in the same manner as shown in FIG. 11. For example, receiver side data transfer receiver circuits are referred to as RX0, RX1, and RX2, and a receiver side clock transfer receiver circuit is referred to as RCK. In this case, the receiver circuits RX0, RCK, RX1, and RX2 may be disposed in the same manner as the transmitter circuits TX0, TCK, TX1, and TX2 shown in FIG. 11. FIG. 11 shows the arrangement example when the data channel has a multi-channel configuration. Note that the data channel may have a single-channel configuration.

6. Limitations to Bonding Length

When stacking the second semiconductor chip 20 on the first semiconductor chip 10, the wire bonding length is limited by the mounting design rule. It is desirable that the size of the second semiconductor chip 20 be as small as possible in order to reduce cost. On the other hand, the number of pads which can be disposed in the second semiconductor chip 20 is limited as the chip size becomes smaller. Therefore, wires must be bonded to the second semiconductor chip 20 while satisfying such limitations.

This embodiment employs the following method in order to achieve this object. In FIG. 12, the length of the side SB2 of the second semiconductor chip 20 is referred to as LB, and the length of the side SA2 of the first semiconductor chip 10 parallel to the side SB2 is referred to as LA. The design rule maximum length of wires 610 and 612 (e.g. wires connected to interconnect patterns 600 and 602 on substrate) connected to the pads (electrodes) of the second semiconductor chip 20 from the pad to the edge (A1 and A2 in FIG. 12) of the first semiconductor chip 10 when viewed from the top side is referred to as LM. In FIG. 12, the relational expression "$LB \geq LA - 2 \times LM$" is satisfied for the length LB of the side SB2 (long side) of the second semiconductor chip 20. Specifically, the second semiconductor chip 20 is formed to have a narrow shape so that the relational expression "$LB \geq LA - 2 \times LM$" is satisfied.

In more detail, the length of the side SB1 of the second semiconductor chip 20 is determined based on the arrangement pitch of the transmitter circuits TX0, TCK, TX1, and TX2 of the physical layer circuit 40 shown in FIG. 11 and the arrangement pitch of the high-speed serial transfer pads D0M to D2P. The length of the side SB2 of the second semiconductor chip 20 is determined based on the relational expression "$LB \geq LA - 2 \times LM$" shown in FIG. 12. The shape of the second semiconductor chip 20 is determined in this manner, and the CAP region 74 shown in FIG. 11 is disposed in the remaining region.

According to the above-described method of this embodiment, the design rule of the maximum length LM of the wires 610 and 620 can be satisfied. Moreover, the pad region 83 on the side SB3 can be provided in addition to the pad region 81 on the side SB1, and wires can be bonded to the pads in the pad region 83. Therefore, the number of pads disposed in the second semiconductor chip 20 can be increased, whereby parallel transfer and transfer of various types of information between the second semiconductor chip 20 and the internal circuit 12 of the first semiconductor chip 10 can be facilitated.

7. Modification

Figure 13A:
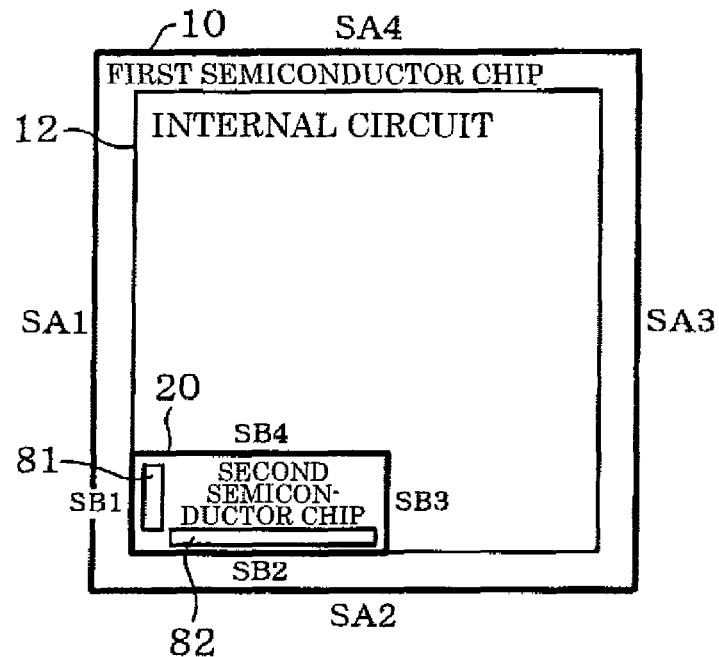
FIGS. 13A and 13B are modifications according to one embodiment of the invention.

The arrangement method for the first and second semiconductor chips 10 and 20 and the circuits included in the first and second semiconductor chips 10 and 20 is not limited to the above-described method. Various modifications and variations may be made. For example, the second semiconductor chip 20 may be stacked so that the corner of the internal circuit 12 coincides with the corner of the second semiconductor chip 20, as shown in FIG. 13A. As shown in FIG. 13A, the pad regions 81 and 82 may be provided on the sides SB1 and SB2, and the pad region may not be provided on the sides SB3 and SB4.

Figure 13B:
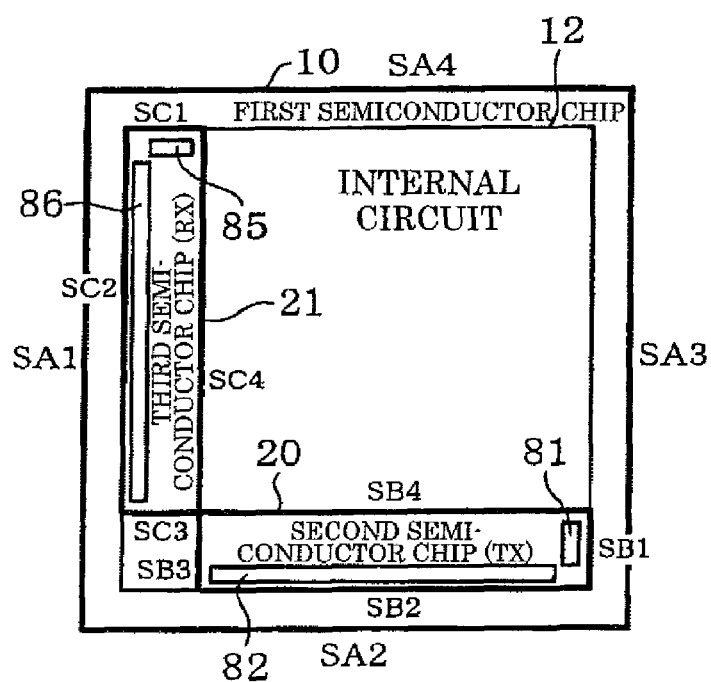

As shown in FIG. 13B, a third semiconductor chip 21 may be stacked on the first semiconductor chip 10 in addition to the second semiconductor chip 20. In this case, a transmitter (TX) side high-speed serial I/F circuit may be provided in the second semiconductor chip 20, and a receiver (RX) side high-speed serial I/F circuit may be provided in the third semiconductor chip 21. The pad regions 81 and 82 of the second semiconductor chip 20 and pad regions 85 and 86 of the third semiconductor chip 21 may be disposed at such positions that wires bonded to the pads of the second semiconductor chip 20 do not intersect wires bonded to the pads of the third semiconductor chip 21. A high-speed serial I/F circuit which can transmit and receive data may be provided in the second semiconductor chip 20 without providing the third semiconductor chip 21.

The high-speed serial transfer method according to this embodiment is not limited to the method described in this embodiment. For example, various methods as shown in FIGS. 14A, 14B, and 15 may also be employed.

Figure 14A:
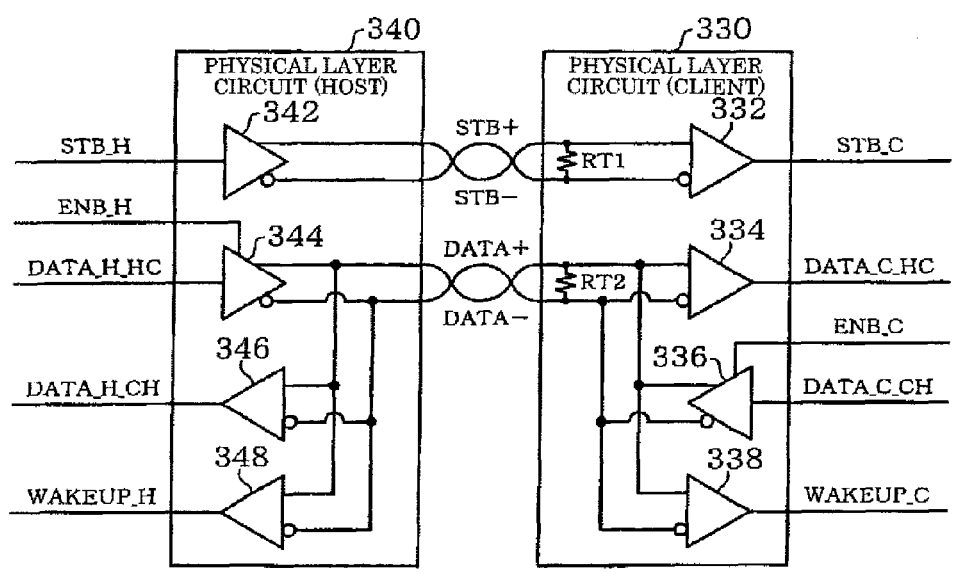
FIGS. 14A and 14B illustrate an example of a serial transfer method.
Figure 14B:
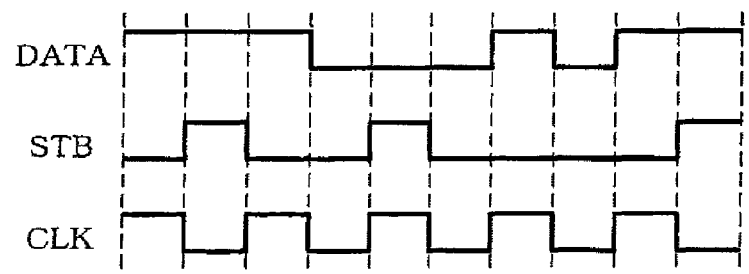

FIGS. 14A and 14B illustrate an example of a high-speed serial transfer method according to the MDDI standard. In FIG. 14A, a physical layer circuit 340 (transceiver) is provided in a host device, and a physical layer circuit 330 is provided in a display driver. Reference numerals 336, 342, and 344 indicate transmitter circuits, and reference numerals 332, 334, and 346 indicate receiver circuits. Reference numerals 338 and 348 indicate wakeup detection circuits. The host-side transmitter circuit 342 drives differential strobe signals STB+/−. The client-side receiver circuit 332 amplifies the voltage across a resistor RT1 generated by driving the differential strobe signals STB+/−, and outputs a strobe signal STB_C to the circuit in the subsequent stage. The host-side transmitter circuit 344 drives differential data signals DATA+/−. The client-side receiver circuit 334 amplifies the voltage across a resistor RT2 generated by driving the data signals DATA+/−, and outputs a data signal DATA_C_HC to the circuit in the subsequent stage.

As shown in FIG. 14B, the transmitter side generates a strobe signal STB by calculating the exclusive OR of a data signal DATA and a clock signal CLK, and transmits the strobe signal STB to the receiver side through a high-speed serial bus. The receiver side calculates the exclusive OR of the data signal DATA and the strobe signal STB to reproduce the clock signal CLK.

Figure 15:
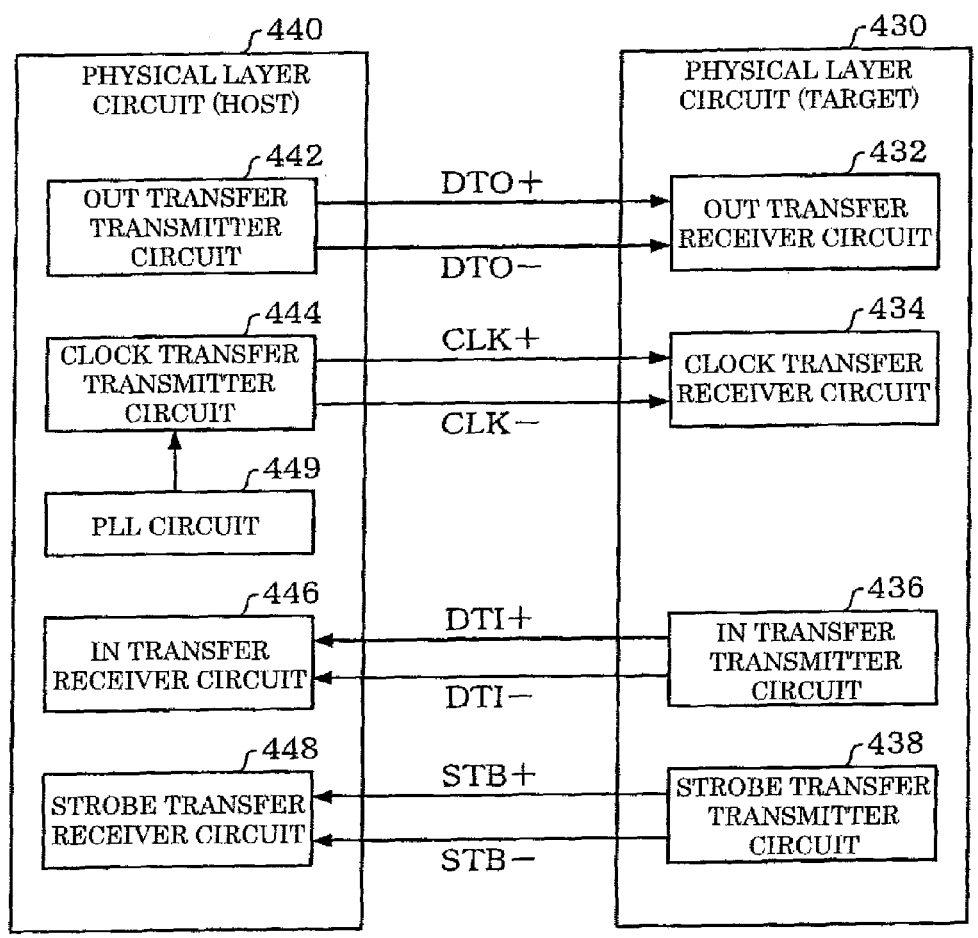
FIG. 15 is another example of the serial transfer method.

In the high-speed serial transfer method shown in FIG. 15, DTO+ and DTO− indicate differential data signals (OUT data) output from a host-side transmitter circuit 442 to a target-side receiver circuit 432. CLK+ and CLK− indicate differential clock signals output from a host-side transmitter circuit 444 to a target-side receiver circuit 434. The host side outputs the data signals DTO+/− in synchronization with the edge of the clock signals CLK+/−. Therefore, the target can sample and hold the data signals DTO+/− using the clock signals CLK+/−. In FIG. 15, the target operates based on the clock signals CLK+/− supplied from the host. Specifically, the clock signals CLK+/− serve as a target-side system clock signal. Therefore, a PLL circuit 449 is provided in the host and is not provided in the target.

DTI+ and DTI− indicate differential data signals (IN data) output from a target-side transmitter circuit 436 to a host-side receiver circuit 446. STB+ and STB− indicate differential strobe signals output from a target-side transmitter circuit 438 to a host-side receiver circuit 448. The target generates and outputs the strobe signals STB+/− based on the clock signals CLK+/− supplied from the host. The target outputs the data signals DTI+/− in synchronization with the edge of the strobe signals STB+/−. Therefore, the host can sample and hold the data signals DTI+/− using the strobe signals STB+/−.

8. Electronic Instrument

Figure 16A:
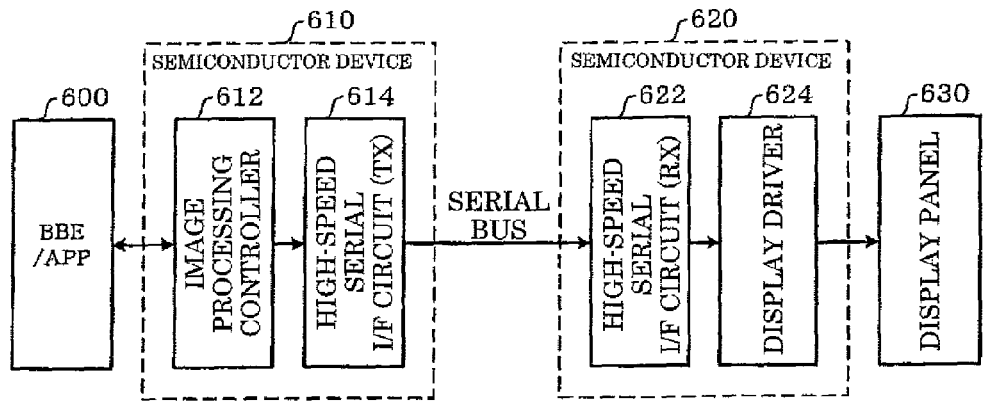
FIGS. 16A, 16B, and 16C are configuration examples of an electronic instrument.
Figure 16B:
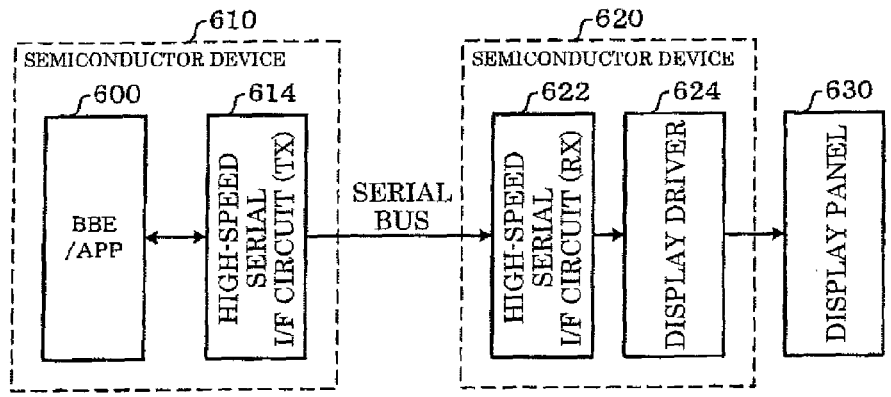
Figure 16C:
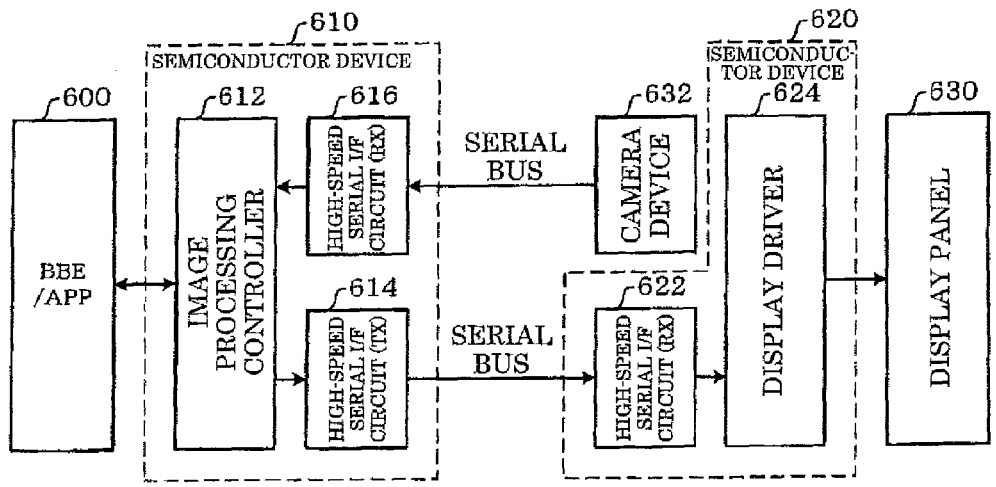

FIGS. 16A, 16B, and 16C show configuration examples of an electronic instrument including a semiconductor device (integrated circuit device) according to this embodiment.

In FIG. 16A, the electronic instrument includes a baseband engine/application processor (BBE/APP) 600, semiconductor devices 610 and 620, and a display panel 630. The semiconductor device 610 includes an image processing controller 612 and a high-speed serial I/F circuit 614. The image processing controller 612 is included in a first semiconductor chip, and the high-speed serial I/F circuit 614 is included in a second semiconductor chip stacked on the first semiconductor chip. The semiconductor device 620 includes a high-speed serial I/F circuit 622 and a display driver 624. The display driver 624 is included in a first semiconductor chip, and a high-speed serial I/F circuit 622 is included in a second semiconductor chip.

The image processing controller 612 functions as an image processing graphic engine, and performs image (still image or moving image) processing such as compression, decompression, or sizing. The display driver 624 drives data lines and scan lines of the display panel 630. The display panel 630 performs a display operation based on data serially transferred by the semiconductor devices 610 and 620. As the display panel 630, an active matrix type panel using a switching element (two-terminal nonlinear element) such as a thin film transistor (TFT) or a thin film diode (TFD) may be used, for example. Or, a simple matrix type panel or a panel other than a liquid crystal panel (e.g. organic EL panel) may be used as the display panel 630.

The BBE/APP 600 and the semiconductor device 610 are mounted on a first circuit board in a first instrument section of the electronic instrument (e.g. portable telephone), and the semiconductor device 620 and the display panel 630 are mounted on a second circuit board in a second instrument section of the electronic instrument. Data is transferred between the first and second instrument sections by high-speed serial transfer through the serial bus. Therefore, the number of signal lines passing through a connection section (e.g. hinge) between the first and second instrument sections can be reduced.

In FIG. 16B, the electronic instrument includes the semiconductor devices 610 and 620 and the display panel 630. The semiconductor device 610 includes the BBE/APP 600 and the high-speed serial I/F circuit 614. The BBE/APP 600 is included in the first semiconductor chip, and the high-speed serial I/F circuit 614 is included in the second semiconductor chip. The semiconductor device 620 includes the high-speed serial I/F circuit 622 and the display driver 624. The display driver 624 is included in the first semiconductor chip, and the high-speed serial I/F circuit 622 is included in the second semiconductor chip. In FIG. 16B, the image processing controller 612 which functions as a coprocessor for the BBE/APP 600 is not provided, differing from FIG. 16A.

In FIG. 16C, the electronic instrument includes the BBE/APP 600, the semiconductor devices 610 and 620, the display panel 630, and a camera device 632. The semiconductor device 610 includes the image processing controller 612, the transmitter high-speed serial I/F circuit 614, and a receiver high-speed serial I/F circuit 616. The image processing controller 612 is included in the first semiconductor chip, and the high-speed serial I/F circuits 614 and 616 are included in the second and third semiconductor chips respectively stacked on the first semiconductor chip. The high-speed serial I/F circuits 614 and 616 may be included in the second semiconductor chip without providing the third semiconductor chip. The semiconductor device 620 includes the high-speed serial I/F circuit 622 and the display driver 624. The display driver 624 is included in the first semiconductor chip, and the high-speed serial I/F circuit 622 is included in the second semiconductor chip. The camera device 632 is connected with the high-speed serial I/F circuit 616 through the serial bus. According to the configuration shown in FIG. 16C, not only display data displayed in the display panel 630, but also data captured by the camera device 632 can be serially transferred through the serial bus.

The electronic instrument according to this embodiment is not limited to the portable telephone, but may be a digital camera, PDA, electronic notebook, electronic dictionary, projector, rear-projection television, portable information terminal, or the like.

Although only some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g. high-speed serial I/F circuit, high-speed logic circuit, logic circuit, pad, pad region, or first to Nth transmitter circuits) cited with a different term (e.g. serial interface circuit, first logic circuit, second logic circuit, electrode, electrode region, or transmitter circuits TX0, TX1, and TX2) having a broader meaning or the same meaning at least once in the specification and the drawings can be replaced by the different term in any place in the specification and the drawings.

The configuration and the arrangement of the first and second semiconductor chips and the serial interface circuit are not limited to the configuration and the arrangement described in the above embodiment. For example, the second semiconductor chip may be disposed at a position differing from the position shown in FIG. 1B, or each circuit and electrode region of the serial interface circuit may be disposed at a position differing from the position shown in FIGS. 4B and 12. The serial transfer method through the serial bus or the like is not limited to the method described in the above embodiment. For example, the clock transfer transmitter circuit or receiver circuit may be omitted, or a circuit which does not use differential signals may be used as the clock transfer transmitter circuit or receiver circuit.

What is claimed is:

1. A semiconductor device comprising:
a serial interface circuit that transfers serial data through a serial bus,
the serial interface circuit including:
a first data transfer circuit;
a clock transfer circuit; and
a second data transfer circuit;
the first data transfer circuit, the clock transfer circuit and the second data transfer circuit being disposed along a first side of the semiconductor device,
the clock transfer circuit being disposed between the first data transfer circuit and the second data transfer circuit,
in a single-channel mode, data being configured to be transferred by the first data transfer circuit, a clock signal being configured to be transferred by the clock transfer circuit, and
in a two-channel mode, the data being configured to be transferred by the first data transfer circuit and the second data transfer circuit, the clock signal being configured to be transferred by the clock transfer circuit.

2. The semiconductor device according to claim 1,
the serial interface circuit including a third data transfer circuit,
the first data transfer circuit, the clock transfer circuit, the second data transfer circuit and the third data transfer circuit being disposed along the first side of the semiconductor device,
the second transfer circuit being disposed between the clock transfer circuit and the third data transfer circuit, and
in a three-channel mode, the data being configured to be transferred by the first data transfer circuit, the second data transfer circuit and the third data transfer circuit, the clock signal being configured to be transferred by the clock transfer circuit.

3. The semiconductor device according to claim 1,
the serial interface circuit, including a physical layer circuit that transfers data through the serial bus,
the physical layer circuit including:
the first data transfer circuit;
the clock transfer circuit; and
the second data transfer circuit.

4. The semiconductor device according to claim 3,
the serial interface circuit including:
a first logic circuit that includes at least one of a parallel/serial conversion circuit that converts parallel data from an internal circuit of the semiconductor device into serial data and a serial/parallel conversion circuit that converts serial data from an external device into parallel data.

5. The semiconductor device according to claim 4,
the serial interface circuit including:
a second logic circuit that includes an internal interface circuit that transfers parallel data between the serial interface circuit and the internal circuit of the semiconductor device.

6. The semiconductor device according to claim 1, further comprising:
a first plurality of electrodes that electrically connect an external device and the serial interface circuit, the first plurality of electrodes being disposed along the first side of the semiconductor device.

7. The semiconductor device according to claim 6,
the first plurality of electrodes including:
a first serial-transfer data electrode connected to the first data transfer circuit;
a serial-transfer clock electrode connected to the clock transfer circuit; and
a second serial-transfer data electrode connected to the second data transfer circuit.

8. The semiconductor device according to claim 7,
the first serial-transfer data electrode, the serial-transfer clock electrode and the second serial-transfer data electrode being disposed along the first side of the semiconductor device, and
the serial-transfer clock electrode being disposed between the first serial-transfer data electrode and the second serial-transfer data electrode.

9. The semiconductor device according to claim 1,
the first side being a short side of the semiconductor device.

10. An electronic instrument comprising:
the semiconductor device according to claim 1; and
a display panel that performs a display operation based on data serially transferred by the semiconductor device.

* * * * *